(12) United States Patent
Futatsuyama

(10) Patent No.: US 7,379,335 B2
(45) Date of Patent: May 27, 2008

(54) NONVOLATILE SEMICONDUCTOR MEMORY DEVICE AND A METHOD FOR PROGRAMMING NAND TYPE FLASH MEMORY

(75) Inventor: Takuya Futatsuyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 113 days.

(21) Appl. No.: 11/495,463

(22) Filed: Jul. 31, 2006

(65) Prior Publication Data

US 2007/0025152 A1   Feb. 1, 2007

(30) Foreign Application Priority Data

Aug. 1, 2005  (JP) .............................. 2005-222698

(51) Int. Cl.
*G11C 11/34* (2006.01)
(52) U.S. Cl. .............................. 365/185.17; 365/185.18
(58) Field of Classification Search ........... 365/185.17, 365/185.18, 185.23
See application file for complete search history.

(56) References Cited

U.S. PATENT DOCUMENTS

| | | | | |
|---|---|---|---|---|
| 6,044,017 | A * | 3/2000 | Lee et al. ............... | 365/185.18 |
| 6,621,735 | B2 * | 9/2003 | Nakamura et al. ..... | 365/185.17 |
| 6,845,042 | B2 * | 1/2005 | Ichige et al. ........... | 365/185.17 |
| 7,184,309 | B2 * | 2/2007 | Matsunaga et al. .... | 365/185.17 |
| 2005/0105334 | A1 | 5/2005 | Futatsuyama | |
| 2005/0213385 | A1 | 9/2005 | Hosono et al. | |
| 2006/0072359 | A1 | 4/2006 | Futatsuyama et al. | |

FOREIGN PATENT DOCUMENTS

| | | |
|---|---|---|
| JP | 2000-49245 | 2/2000 |
| JP | 2000-90679 | 3/2000 |
| JP | 2000-149577 | 5/2000 |
| JP | 2000-228097 | 8/2000 |
| JP | 2001-101880 | 4/2001 |

OTHER PUBLICATIONS

June Lee, et al., "A 1.8V 2Gb NAND Flash Memory for Mass Storage Applications", 2003 IEEE International Solid-State Circuits Conference, Session 16, 2003, pp. 236-237.

* cited by examiner

*Primary Examiner*—Ahn Phung
(74) *Attorney, Agent, or Firm*—Oblon, Spivak, McClelland, Maier & Neustadt, P.C.

(57) ABSTRACT

A non-volatile semiconductor memory device comprise a memory cell array having a plurality of memory cell units each having a plurality of electrically-programmable memory cell connected in series, a plurality of word lines each connected to each of control gates of said plurality of memory cells, said plurality of word lines including a selected word line connected to a control gate of selected one of said memory cells for programming, and a plurality of unselected word lines different from said selected word line, a bit line connected to one end of said memory cell unit, and a source line connected to another end of the memory cell unit, wherein, when data is programmed into the selected memory cells, a first potential is supplied to said selected word line, and a first unselected word line adjacent, toward a source line side, to said selected word line is set to floating state, and thereafter, a second potential which is higher than said first potential is supplied to said selected word line.

20 Claims, 16 Drawing Sheets

FIG. 15
(a) EASB Type  (b) EASB2 Type
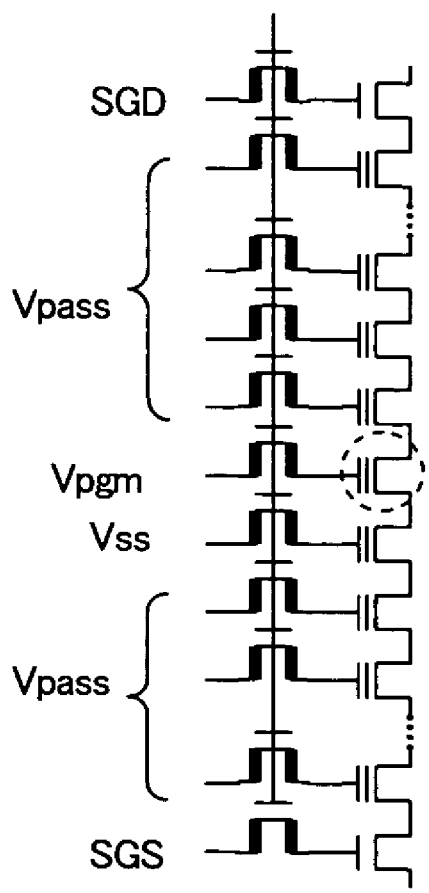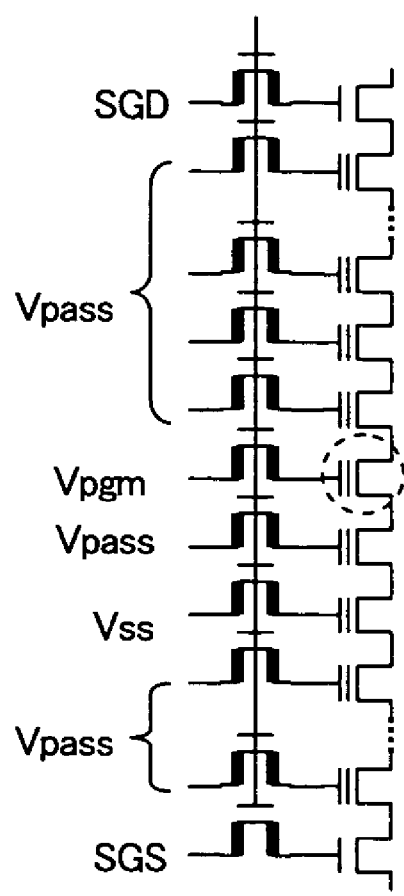
 Programmed Cell

FIG. 16
(a) 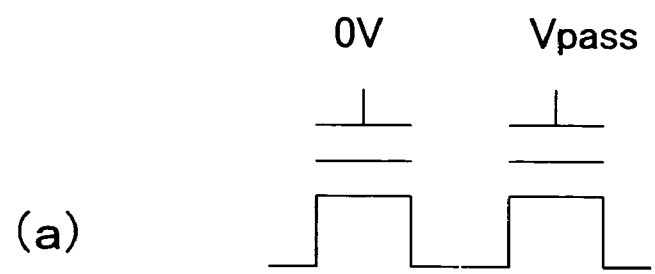
(b) 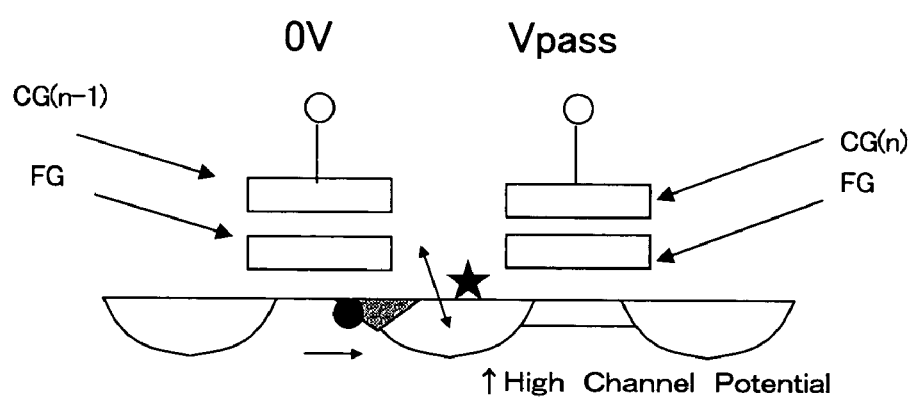
(c) 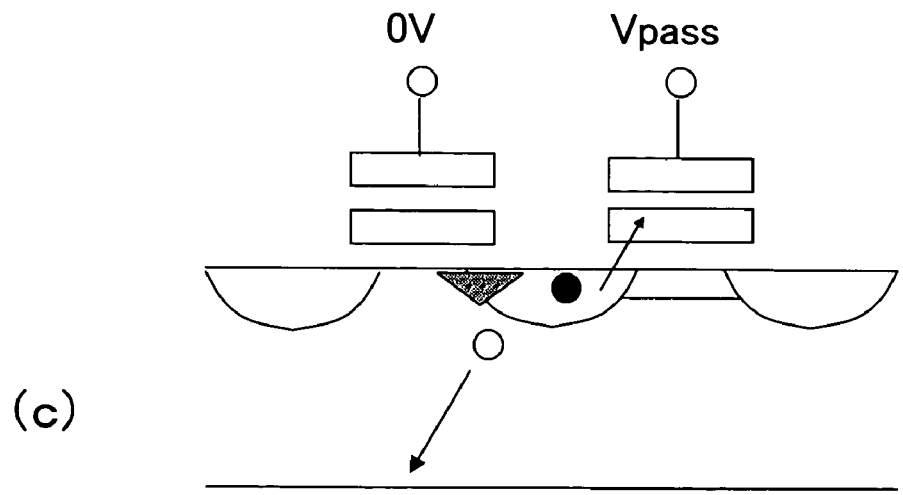

NONVOLATILE SEMICONDUCTOR MEMORY DEVICE AND A METHOD FOR PROGRAMMING NAND TYPE FLASH MEMORY

CROSS-REFERENCE TO RELATED APPLICATIONS

This application is based upon and claims the benefit of priority from the prior Japanese Patent Application No. 2005-222698, filed on Aug. 1, 2005, the entire contents of which are incorporated herein by reference.

TECHNICAL FIELD

The present invention relates to an electrically programmable nonvolatile semiconductor memory device and its programming method, and more particularly to a method for data programming NAND type flash memory.

BACKGROUND OF THE INVENTION

Recently, demand for nonvolatile semiconductor memory devices which are compact and have large capacity have been increasing rapidly. Among these, a NAND type flash memory, in which higher integration and larger capacity are expected as compared with a conventional NOR type flash memory, has attracted attention.

In the program operation of a conventional NAND type flash memory, Self Boost Method (SB) is used, wherein NAND cell units including memory cells which are not to be programmed are separated from bit lines and the potential of the channels of the memory cells which are not to be programmed are raised up to a predetermined program inhibition potential by capacitive coupling with the word lines, so that inhibits to program into memory cells which are not to be programmed (which are not to be injected with electrons) sharing word lines (Selected word lines) with selected memory cells which are to be programmed. Data programming operation of conventional NAND type flash memories using the SB methods is as follows.

In FIG. 13, changes of set potential waveform of word lines WL0 to WL7 of a NAND cell unit in the data programming operation are shown. The data programming operation of the NAND type flash memory has been performed, usually, sequentially from memory cells at the remotest position from the bit lines.

First, when a data programming operation is initiated, in response to program data, Vss (ground potential, e.g., 0V) are applied when "0" data programming, and Vcc (power supply voltage, e.g., 3V) are applied when "1" data programming, on bit lines of selected NAND cell unit; and Vcc is applied to a selected bit line side selection gate line. In this case, when the bit line is Vss ("0" data programming), in the selected NAND cell unit, channels inside of the NAND cell are fixed to Vss via the selection gate transistor in the selected NAND cell unit connected to the bit line. When the bit line is Vcc ("1" data programming), channels inside of the NAND cell in the connected selected NAND cell unit are charged to [Vcc-Vtsg] (note that Vtsg is the threshold voltage of the selection gate transistor, e.g., about 1.5 V) via the selection gate transistor, and then achieves a "floating state."

Subsequently, at the timing t1, unselected word lines in the selected NAND cell unit are raised from Vss to Vpass (pass potential, e.g., 10V), then at the timing t2 the word lines in the selected NAND cell units are raised from Vss to Vpgm (high voltage for programming, e.g., 20 V). FIG. 13 shows an example of a memory cell connected to word line WL2 is a selected memory cell, and the memory cells connected to the other word lines WL0, WL1 and WL3 to WL7 are unselected memory cells.

Here, when the bit line is Vss ("0" data programming), in the selected NAND cell unit connected to the bit line, a large potential difference (about 20V) occurs between the gate (Vpgm potential) and the channel (Vss potential) of the selected memory cell inside of the selected NAND cell unit because the channel in the NAND cell is fixed to Vss, which in turn causes injections of electrons from the channel into the floating gate of the selected memory cell. Hereby, the threshold of the selected memory cell shifts to a positive direction. The state where the electrons are sufficiently injected in the floating gate is "0."

On the other hand, when the bit line is at Vcc ("1" data programming), the channel in the NAND memory cell is in a floating state in the selected NAND cell unit connected to the bit line. Therefore, by influence of capacitive coupling between word lines and the channel, potential of the channel is raised from [Vcc-Vtsg] potential to Vmch potential (program inhibition potential: about 8V), being kept at floating state, accompanied by a rise in the voltage of the word lines (Vss to Vpgm or Vpass). At this time, electron injection does not occur because the potential difference between the gate (Vpgm potential) and the channel (Vmch potential) of the selected memory cell in the selected NAND cell unit is relatively small (about 12 V). Therefore, the threshold of the memory cell is not changed and is kept in a minus state. This state is a data "1." See Japanese Patent Application Laid-open Disclosure No. 2000-228,097 and June Lee, et al., "A 1.8V 2 GB NAND Flash Memory for Mass Storage Applications", 2003 IEEE International Solid-State Circuits Conference, Session 16, pp 236-pp 237.

In the programming operation of the conventional NAND type flash memory described above, at "1" data programming, the channel of the selected memory cell is in a floating state. Therefore, by influence of the capacitive coupling between the word line and the channel, the potential of the channel is raised from [Vcc-Vtsg] potential to Vmch potential, and is kept in a floating state, accompanied by a rise in the voltage of the word lines (Vss to Vpgm or Vpass). However, the potential of the channel could be overly raised from the floating state. Therefore, a surface stress is given in the memory cell having a low control gate potential (Vpass potential: 10 V) adjacent to the memory cell in which data will be programmed. Then electric charges are leaked from the floating channel, i.e., GIDL (Gate Induced Drain Leakage) may occur. By the GIDL, electric charges are easily injected into the floating gate of unselected memory cell adjacent to the selected memory cell. As a result, program errors can easily occur.

Also, FIG. 14 shows a method for supplying a pass potential Vpass first, and then supplying a high potential to programming Vpgm, in the control gate of the selected memory cell, which is described in Japanese Patent Application Laid-open Disclosure No. 2000-228,097 and "A 1.8V 2 GB NAND Flash Memory for Mass Storage Applications", (June Lee, et al., 2003 IEEE International Solid-State Circuits Conference, Session 16, p 236 to p 237).

In the conventional method, however, GIDL may not be thoroughly prevented; especially when "1" data programming, leading to program errors and a deterioration in the reliability of the NAND type flash memory.

In a so-called "single level" program whose program data are either "0" or "1," SB method is used. On the other hand, a so-called "multi level" program data, a threshold (Vth) distribution of the memory cells will be wider than the case of two level programming, allowing for plenty of memory cells with a high threshold (Vth). Therefore, a method is used in which the SB method is performed by dividing channels of memory cells closer to the bit line than a memory cell in which programming is performed; and channels of memory cells at the source side. Such a method is called EASB (Erase Area Self Boost) method.

As shown in FIG. 15 (a), the EASB method is a method wherein: a program voltage Vpgm is supplied to a selected word line in which programming is performed; a ground voltage Vss is supplied to a word line adjacent toward the source line side of the selected word line; and an intermediate voltage Vpass is supplied to the other word lines. The advantage of the EASB method is a higher boost efficiency because memory cells closer to the bit line than the memory cell to be programmed are thoroughly at the erased state when programming is performed sequentially from the memory cells in the source side; and thus channel potential of the memory cells can be boosted higher for "1" programming. On the other hand, the disadvantage of the EASB method is that a coupling ratio of the floating gate of the programming memory cells becomes lower when "0" programming is performed, because a potential of the word lines adjacent to the source line side from the selected word line is Vss.

Now, in order to deal with the above disadvantage of the EASB method, a program method, in which the bias method of the EASB method is changed, is used. This method is called an EASB-2 method.

As shown in FIG. 15 (b), the EASB-2 method is a method, wherein: a program voltage Vpgm is supplied to a selected word line in which programming is performed; a ground voltage Vss is supplied to a word line which is the second adjacent word line toward the source line end from the selected word line; and an intermediate voltage Vpass is supplied to the other word lines. The advantage of the EASB-2 method is, compared with those of the EASB method, a coupling ratio of the floating gate of the program cell is raised when "0" programming, so the program voltage Vpgm can be lowered; further there is an advantage that, at "1" programming the memory cells of the bit line side are one more than the program memory cells, and therefore a capacitance of the memory cell channel is larger, so that program errors caused by the leakage current at the channel boost period tend not to occur. However, there is a disadvantage in both the EASB method and EASB-2 method, that the closer the selected word lines to the bit line, the higher the boost effect becomes in the memory cells on the bit line side, than in the program memory cells, and thus the potential of the memory cell channels become too high. In the following, a problem in the case that the potential of the memory cell channels become too high by the EASB-2 method will be discussed in detail referring to FIG. 16.

In the EASB-2 method, at "1" programming, CG (n−1) is set at 0 V and CG (n) is boosted at Vpass (FIG. 16 (a)), and a potential of the memory cell channel become high (FIG. 16 (b)) at a shared junction between memory cell transistor of CG (n−1) and memory cell transistor of CG (n). In the memory cell of CG (n−1), electrons (●) are accelerated by a high electric field between the source and the drain, and reach to the drain edge (a shared junction among the memory cell transistors), and then a pair of a hot-electron (●) and a hot-hole (○) generates on a surface at a drain side of the CG (n−1) (★ in FIG. 16 (b)). At this time, if a high potential difference between a gate potential (OV) of CG (n−1) and a potential of a cell channel occurs, the hot-hole flows to a memory cell P-well (GIDL) and the hot-electron is injected into the floating gate of the memory cell transistor in which high electric field is applied, at a certain probability (FIG. 16 (c)). As a result, a threshold of the memory cells of the CG (n) (Vth) becomes higher as programming is performed. Now, if the potential of CG (n) is lowered to a voltage lower than Vpass, it is possible to inhibit the injection of the hot-electrons into the floating gate. However it is difficult to suppress the GIDL to a sufficient level.

BRIEF SUMMARY OF THE INVENTION

Accordingly, this invention deals with the above mentioned problems and attempts to provide a highly reliable non-volatile semiconductor memory device, such as NAND type flash memory, to suppress GIDL which usually occurs during "1" data programming and to suppress program errors without making great changes to flash memory device structures.

A non-volatile semiconductor memory device according to one embodiment of this invention comprises: a memory cell array having a plurality of memory cells units each having a plurality of electrically-programmable memory cell connected in series; a plurality of word lines each connected to each of the control gates of said plurality of memory cells, said plurality of word lines including a selected word line connected to a control gate of selected one of said memory cells for programming, and a plurality of unselected word lines different from said selected word line; a bit line connected to one end of said memory cell unit; and a source line connected to an other end of the memory cell unit; wherein, when data is programmed into the selected memory cells, a first potential is supplied to said selected word line, and a first unselected word line adjacent, toward the source line side, to said selected word line is made to float, and thereafter, a second potential which is higher than said first potential is supplied to said selected word line.

Furthermore, a method according to one embodiment of this invention is for programming a NAND-type flash memory having a selection gate transistor and a series connected memory cells comprising: a first step for providing a Vcc to turn on said selection gate transistor, providing a Vpass higher than said Vcc to a selected word line, floating a first adjacent word line which is adjacent to said selected word line, and providing said Vpass to some of unselected word lines; and a second step following said first step for providing Vpgm which is higher than said Vpass to the selected word line.

BRIEF DESCRIPTION OF THE DRAWINGS

FIG. 15 is a figure explaining a driving method for a conventional EASB method and conventional EASB 2 method.

FIG. 16 is a figure shows an explanation of the problem in the case where the cell channels potential becomes too high in the conventional EASB 2 method.

DETAILED DESCRIPTION OF THE PREFERRED EMBODIMENTS

Hereafter, a nonvolatile semiconductor memory device according to one embodiment of this invention will be described.

First Embodiment

Figure 1:
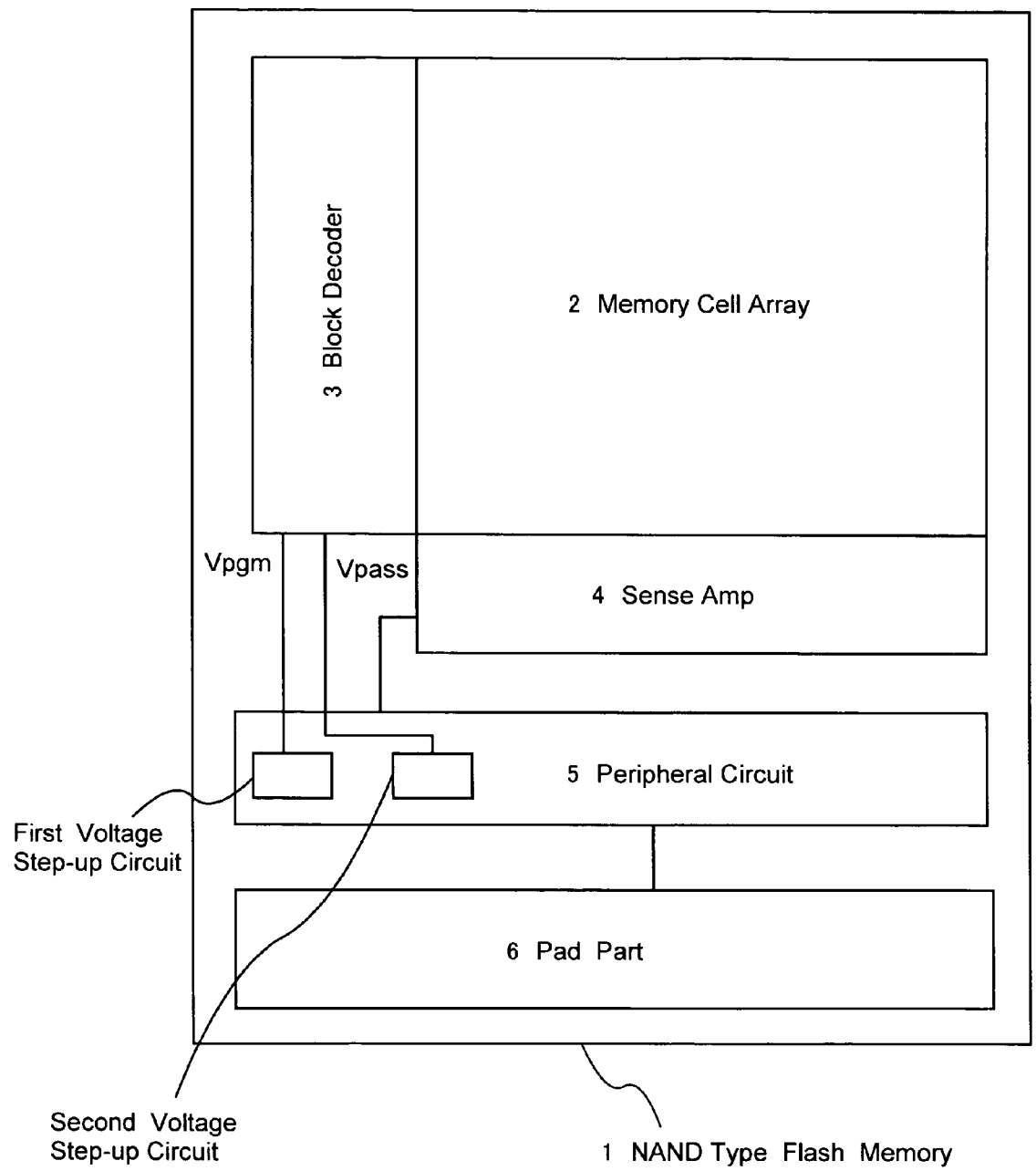
FIG. 1 is a schematic block diagram of NAND type flash memory 1 according to one embodiment of a nonvolatile semiconductor memory device of the present invention.

FIG. 1 shows a schematic block diagram of a NAND type flash memory according to one embodiment for a nonvolatile semiconductor memory device of the present invention. NAND type flash memory 1 shown in FIG. 1 comprises a memory cell array 2 in which a plurality of electrically programmable memory cells are arranged in matrix, a block decoder 3, a sense amplifier 4, a peripheral circuit 5, and a pad part.

Figure 2:
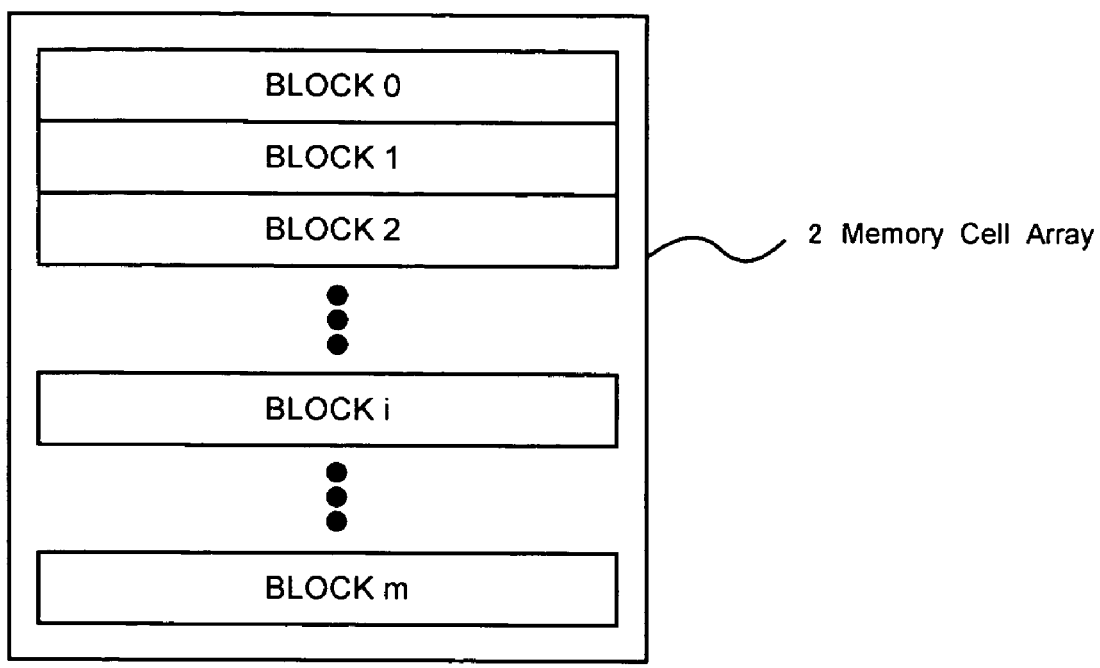
FIG. 2 is a figure showing a configuration of a memory cell array 2 of the NAND type flash memory according to one embodiment of a nonvolatile semiconductor memory device of the present invention.

FIG. 2 shows a configuration of the memory cell array 2. As shown in FIG. 2, the memory cell array 2 is divided into total m blocks (BLOCK 0, BLOCK 1, . . . , BLOCKi, . . . , BLOCKm). "Block" is a minimum unit for a data erasure.

Figure 3:
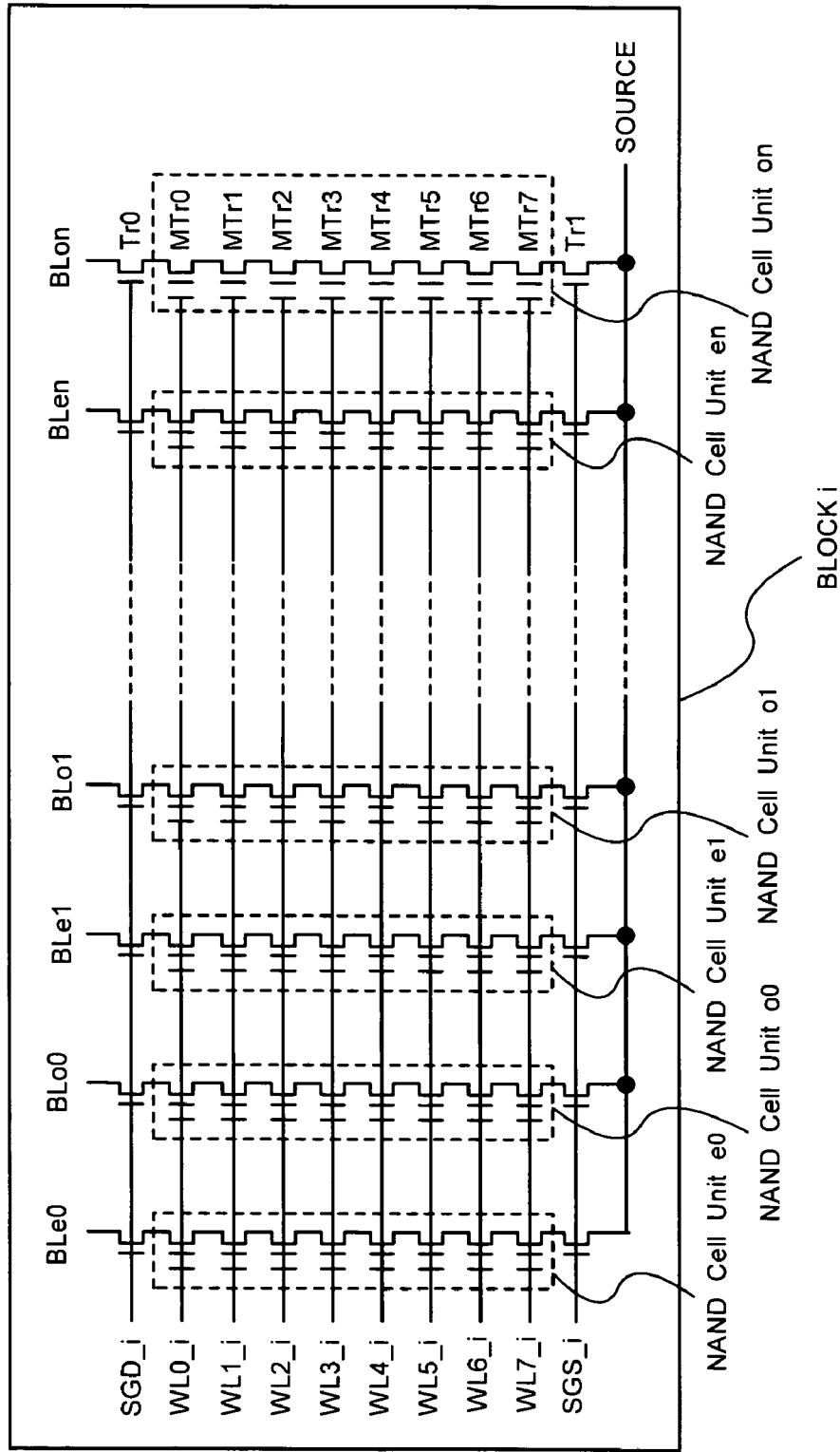
FIG. 3 is a figure showing a configuration of a memory block BLOCKi of the NAND type flash memory according to one embodiment of a nonvolatile semiconductor memory device of the present invention.

Each of the blocks BLOCK 0 to BLOCK m is configured with 2n NAND cell units e 0 to en, as FIG. 3 shows representative BLOCKi. In this embodiment, each of the NAND cell units is configured with series-connected 8 memory cells MTr0 to MTr7. The one end is connected to the bit line (BLe0, BL o0, . . . , BL en to BL on) via selection gate transistor Tr0 connected to selection gate line SGD_i; and the other end is connected to a Common Source Line SOURCE via a selection gate transistor Tr1 connected to Selection Gate line SGS_i. The control gates of memory cells MTr are connected to word lines WL(WL0_i to WL7_i). Even bit lines BLe and odd bit lines BLo are subject to data programming and data readings independently. Simultaneous data programming or simultaneous data readings to/from n memory cells connected to even bit lines BLe are performed among 2n memory cells connected to a single word line WL. Each of the memory cells stores one bit data, and n memory cells configure a "page" unit.

Similarly, in this embodiment, another "page" is configured by n memory cells which are connected to one word line WL and bit line BLo of odd numbers, and simultaneous data programming or simultaneous data readings to/from are performed to/from the memory cells in the page.

In this embodiment, a number of blocks constituting the memory cell array 2 are m; and a single BLOCK includes 2n NAND memory cell units each consisting of 8 memory cells. However, it is not limited to this. With respect to the desired memory cell capacity, the number of blocks, the number of memory cells and the number of memory units may be changed. In this embodiment, each of the memory cells stores 1 bit data. However, each of the memory cells may store plural bit data (multi-level bit data) depending on electron injection amounts. Also, in this embodiment, an example is described wherein a driving method of this invention applied to a NAND type flash memory in which one NAND type memory cell unit is connected to a single bit line. However, the driving method of this invention may be applied to a so-called Shared-Bit-Line type NAND type flash memory, wherein plural NAND memory cell units share one bit line.

Figure 4:
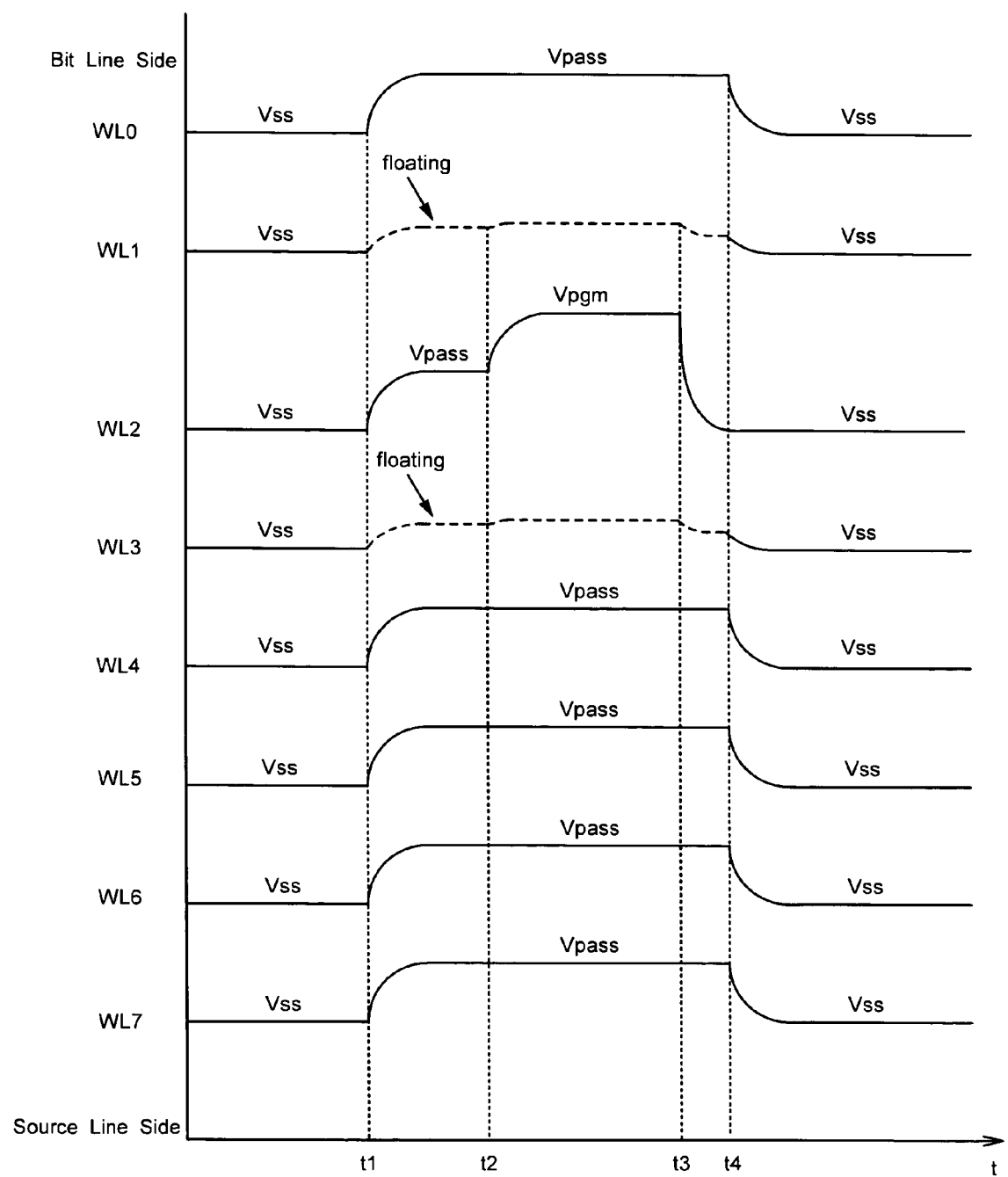
FIG. 4 is a figure showing a change for a set potential of each of the word lines in the selected memory unit of the NAND type flash memory according to one embodiment of a nonvolatile semiconductor memory device of the present invention.

Next, a data programming operation of the NAND type flash memory 1 according to this embodiment is explained. The programming operation of this embodiment is a SB method. FIG. 4 is referred to. FIG. 4 shows changes of set potentials of each of the word lines WL0 to WL7 when an even page of the BLOCKi, for example, is selected, and a memory cell connected to word line WL2 in the selected NAND cell unit (for example, a NAND cell unit e0 of BLOCKi) is selected as a target for data programming. Changes in the potential of the control gate of memory cells connected to each of the word lines are substantially the same as the changes of potentials of each of the word lines except for a small signal delay caused by wiring resistances of each of the word lines.

When data programming operation is initiated, depending on program data, Vss ("0" data programming) or power supply voltage ("1" data programming) is applied to the bit line BLe0 connected to the selected NAND cell unit e0. Vcc is applied to a selected bit line side selection gate line SGD_i. In this case, when the bit line BLe0 is at Vss ("0"

data programming), in the connected and selected NAND cell unit e0, channels of NAND memory cells are fixed to Vss via selection gate transistor Tr0. On the other hand, when bit line BLe0 is at Vcc ("1" data programming), in the connected and selected NAND cell unit e0, channels of memory cells MTr0 to MTr7 are charged to [Vcc-Vstg] (Vtsg is a threshold voltage of the selection gate transistor Tr0, e.g., about 1.5 V) via the selection gate transistor Tr0, and thereafter are set to be at floating state. At this time, Vss is applied to word line WL0 to WL7.

Subsequently at the timing t1, potentials of the unselected word lines WL0, WL4 to 7 in the selected NAND cell unit are changed from Vss to Vpass (about 10 V). At the same time, potential of the selected word line WL2 is changed from Vss to Vpass, and potentials of the unselected word lines WL1 and WL3, both of which are adjacent to the selected word line WL2, are set to be floating (doted lines in FIG. 4). Thus, as shown in FIG. 4, the potentials of the unselected word lines WL1 and WL3, both of which are adjacent to the selected word line WL2 are raised by capacitive coupling with the selected word line WL2.

Then at the timing 2, while the potentials of the unselected word lines WL1 and WL3, both of which are adjacent to the selected word line WL2, are kept floating state, the potential of the selected word line WL2 is changed from Vpass to Vpgm (about 20 V). Accompanied by the raising of the potential of the selected word line WL2 from Vpass to Vpgm, the potentials of the unselected word lines WL1 and WL3, both of which are adjacent to the selected word line WL2 which are in floating state, are raised by the capacitive coupling.

When Vpgm is applied to the selected word line WL2, a charge pump circuit of the program voltage for supplying the potential Vpgm may supply electric charges for stepping up from the potential Vpass to the potential Vpgm only; therefore, an amount of supplied electric charges may be reduced. The output of the Vpgm charge pump circuit will be lowered for a period when it is connected to a capacitive load of the selected word line WL2. However, recovery time for a given output voltage is short, and the same program speed may be realized even though the drivability of the charge pump circuit of the program voltage is smaller, and therefore reduction of the circuit area will be possible. Also, drivability of charge pump circuit of the pass voltage may be lowered because the capacitive load of the word lines in which Vpass is supplied is reduced, and therefore the circuit area may be reduced.

At the timing t2 when the potential of selected word line WL2 is raised from Vpass to Vpgm, a Vss potential is supplied to the bit line if "0" data is programmed into the selected memory cell MTr2. And the voltage of the channel in the NAND cell is fixed to Vss in the selected NAND cell unit e0 connected to the bit line. Therefore, a large potential difference (about 20 V) is generated across the gate (Vpgm potential) of the selected memory cell and the channel (Vss potential) in the NAND cell unit. Further, in the selected memory cell MTr2, electron injection occurs from the channel to the floating gate, thereby shifting the threshold value of the selected memory cell MTr2 to a positive direction.

On the other hand, if "1" data is programmed into the selected memory cell MTr2, Vcc is supplied to the bit line e0. In the selected NAND cell unit e0 connected to the bit line BLe0, the channels of NAND memory cells MTr0 to MTr7 are at floating state. Therefore, by capacitive coupling between each of the word lines and the channels, potential of the channel is raised from [Vcc-Vstg] potential to Vmch potential (program inhibition potential: about 8V) being kept at floating state, accompanied by a voltage rise of the word lines, and thus electron injection does not occur. Further, the potential of the channel could be raised too much from [Vcc-Vtsg] at the floating state. However, in the driving method of the present embodiment, Vpgm potential is applied to the selected word lines, and the potential of the unselected word line adjacent to the selected word lines is raised by the capacitive coupling with the selected word lines; therefore, it may be suppressed to give a surface stress to the selected memory cells. As a result, occurrence of the GIDL, wherein charges are leaked from the channel at a floating state, can be suppressed. Therefore, occurrence of program error in the case of programming "1" data in the selected memory cells will be suppressed.

Figure 13:
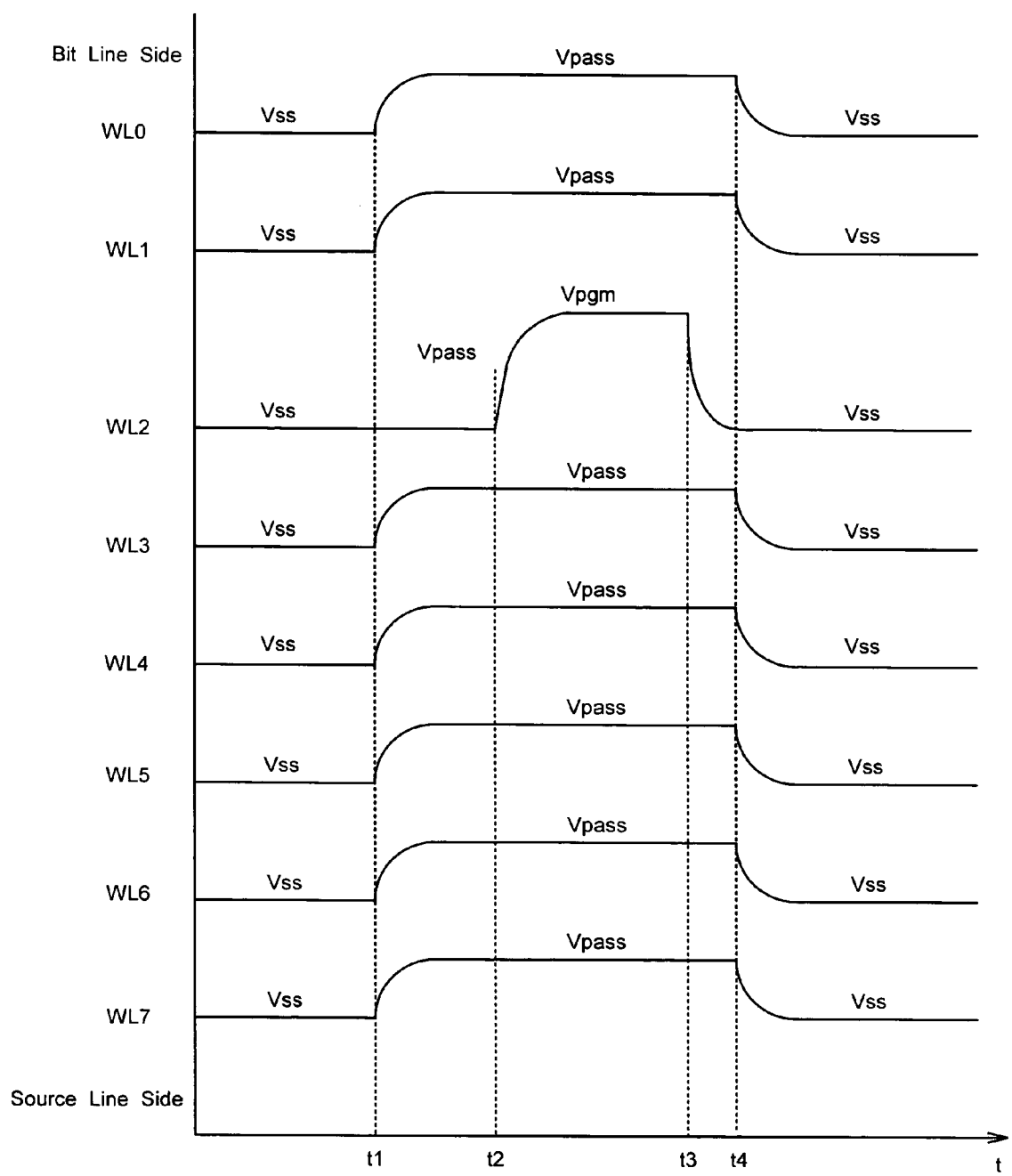
FIG. 13 is a figure showing a change for a set potential of each of the word lines in the selected memory unit of a conventional NAND type flash memory.
Figure 14:
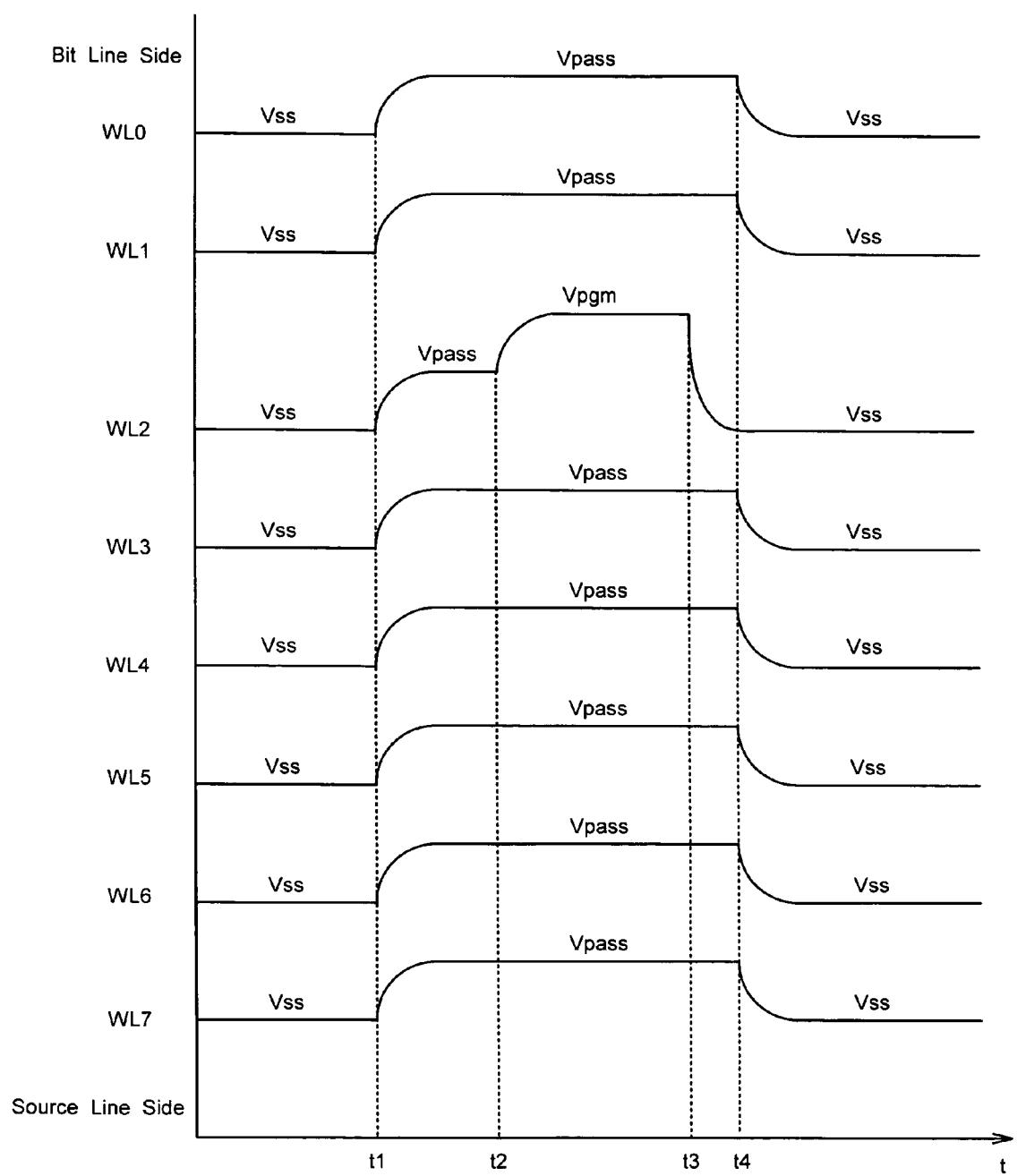
FIG. 14 is a figure showing a change for a set potential of each of the word lines in the selected memory unit of a conventional NAND type flash memory.

Afterwards at the timing t3, the program voltage Vpgm to the selected word lines is discharged to Vss and the data programming to the selected memory cells is terminated. At this time, potentials of the word lines WL1 and WL3 which are adjacent to the selected word line WL2 and are at floating state will be lowered by the capacitive coupling with WL2 because the potential of the selected word line WL2 is lowered; thus, each potential of the word line WL1 and WL3 becomes lower compared with the methods shown in FIG. 13 and FIG. 14. This bias state at the timing t3 also causes the GIDL to be suppressed.

Thereafter, at the timing t4, Vss is supplied to the selected and unselected word lines, and a series of data programming operations is completed. Then a verify-read operation for the data programming is performed.

The above-mentioned operations are performed for the whole pages to be programmed and then the whole data programming operation is completed.

As explained above, in the operation method of the NAND type flash memory in the present embodiment, during program operation, it is not that pass potential Vpass is supplied to the unselected word lines adjacent to the selected word lines connected to the selected memory cells to be programmed, but that, by setting the adjacent unselected word lines at floating state, the potentials are once raised by the capacitive coupling with the selected word lines in which Vpass potentials are supplied. By doing so, it will be suppressed to give a surface stress to the unselected memory cells. As a result, occurrence of the GIDL in which charges are leaked from the channel at floating state will be suppressed. Therefore, occurrence of program error in case of "1" data programming to the selected memory cells will be suppressed.

In the NAND type flash memory and its driving method of the present embodiment, when program voltage (Vpgm) is applied to the selected word lines, the Vpass potential is once applied to the selected word lines; After the potential of the selected word lines is raised, program voltage (Vpgm) is applied; thus, charge pump circuit of program voltage for supplying potential Vpgm will supply charges for rising the potential from Vpass to potential Vpgm only, so the amount of supplied electric charges will be reduced. The output of the Vpgm charge pump circuit will become lower for a period when the circuit is connected to capacitive load of the selected word lines. However, recovery time necessary for the given output voltage becomes shorter, therefore the same program speed will be realized even though the drivability of the charge pump circuit of program voltage is not high, and reduction of the circuit area will be possible. Also, the drivability of charge pump circuit of the pass voltage may be reduced so that the circuit area may be reduced, because capacitive load of the word lines in which Vpass is supplied is reduced.

Second Embodiment

In the present embodiment, another driving method of the NAND type flash memory according to the embodiment of the nonvolatile semiconductor memory devices in the present invention will be explained.

In this embodiment, the configuration is not explained because the configuration is the same as the NAND type flash memory 1 of the above-mentioned embodiment, except for a driving method during programming.

Figure 5:
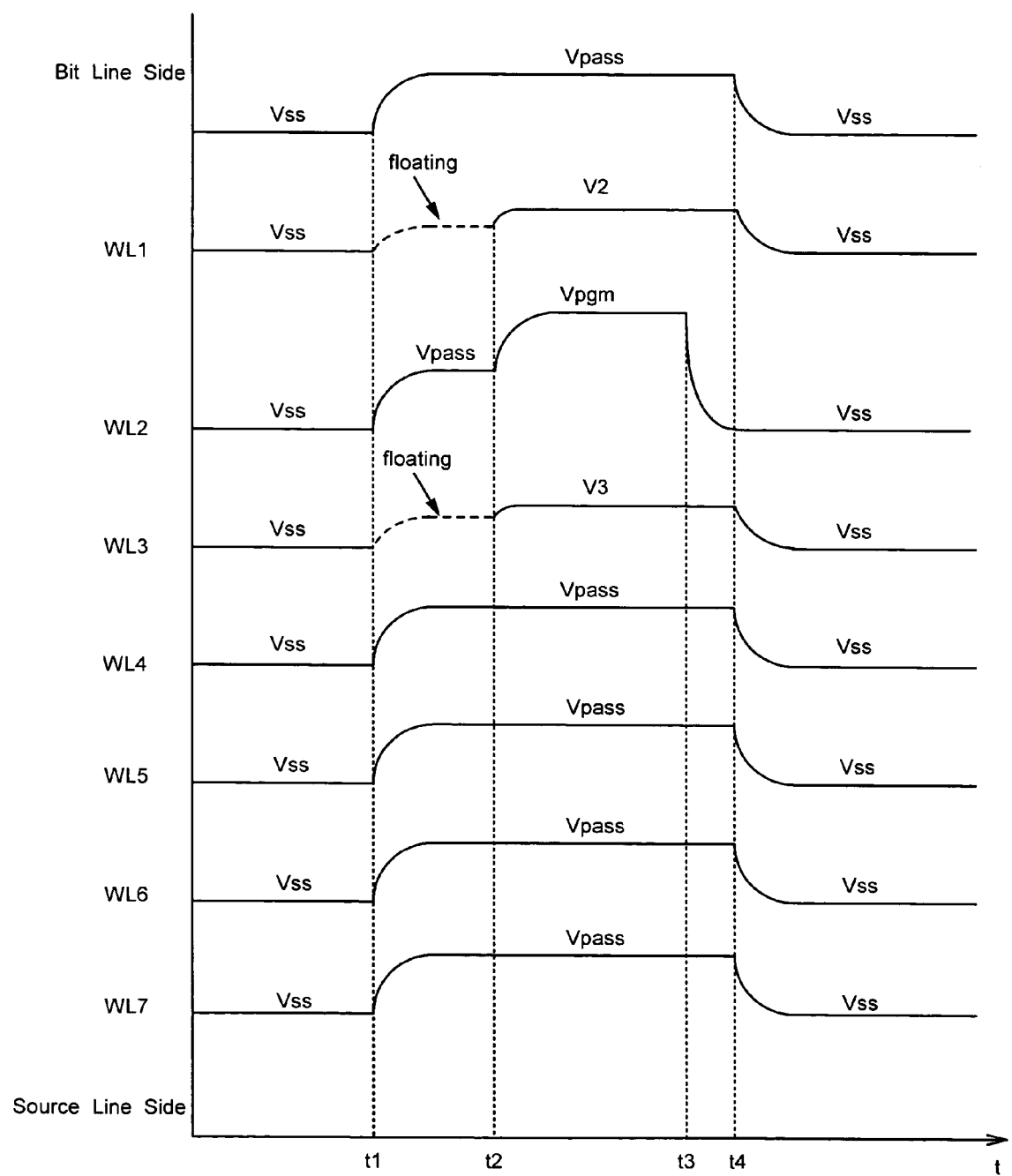
FIG. 5 is a figure showing a change for a set potential of each of the word lines in the selected memory unit of the NAND type flash memory according to one embodiment of a nonvolatile semiconductor memory device of the present invention.

Referring to FIG. 5, a data programming operation of a NAND type flash memory 1 of the present invention will be explained. The program operation of the embodiment is the SB method. In FIG. 5, as explained in the above-mentioned embodiment, changes for set potentials of each of the word lines WL0 to WL7 are shown, in the case where the memory cells are connected to word line WL2 in the selected NAND cell unit in which, for example, even number pages of the BLOCKi is selected for programming (for example, NAND cell unit e0 of the BLOCKi), in the data programming operation of the NAND type flash memory 1.

First, as data programming operation is initiated, Vss ("0" data programming) or power supply voltage Vcc ("1" data programming) is applied to the bit line BLe0 connected to the selected NAND cell unit e0 depending upon the program data; and Vcc is applied to the bit line side selection gate line SGD_i. In this case, when the bit line BLe0 is Vss ("0" data programming), channels in the NAND memory cells are fixed to Vss in the connected and selected NAND cell unit e0 via the selected gate transistor Tr0. On the other hand, when the bit line e0 is Vcc ("1" data programming), the channels of the memory cells Mtr0 to Mtr 7 are set to the floating state, after the memory cells are charged to [Vcc-Vtsg] (however, Vtsg is a threshold voltage of the selection gate transistor Tr0, e.g., about 1.5 V) via the selected gate transistor Tr0. At this time, Vss is applied to the word lines WL0 to WL7.

Subsequently at the timing t1, potentials of the unselected word lines WL0, WL4 to 7 are raised from Vss to Vpass (about 10 V). At the same time, potential of the selected word line WL2 is raised from Vss to Vpass, and the potentials of the unselected word lines WL1 and WL3, both of which are adjacent to the selected word line WL2, are set to be at the floating state (dotted lines in FIG. 5). By doing this, as shown in FIG. 5, the potentials of the unselected word lines WL1 and WL3, both of which are adjacent to the selected word line WL2 are raised by capacitive coupling with the selected word line WL2.

Afterwards at the timing t2, the potential of the selected word line WL2 in the selected NAND cell unit e0 is raised from Vpass to Vpgm (about 20 V). At the same time, potential V2 is applied to the unselected word line WL1 adjacent, toward the bit line, to the selected word line WL2, and potential V3 is applied to the unselected word line WL3, which is adjacent, toward the source line, to the selected word line WL2, where in Vcc<V2, V3; and V2, V3=<Vpass. Especially, the potential V2 applied to the unselected word line WL1 may be Vpass.

When Vpgm is applied to the selected word line WL2, a charge pump circuit of the program voltage for applying potential Vpgm supplies the electric charges between potential Vpass to potential Vpgm only so that the amount of supplied charge may be reduced. The output of the Vpgm charge pump circuit will be lower for a period when the circuit is connected to the capacitive load of the selected word line WL2. However, the time required for a given output voltage becomes shorter and the same program speed may be realized even though the drivability of the charge pump circuit of program voltage is lower, and thus a reduction of the circuit area will be possible. Also, the drivability of the charge pump circuit of pass voltage may be lowered because the capacitive load of the word lines in which Vpass is applied is reduced, and thus the circuit area may be reduced.

At the timing t2, at the state that the potential of the selected word line WL2 is raised from Vpass to Vpgm, Vss potential is supplied to the bit line BLe0 if "0" data is programmed into the selected memory cell MTr2. In the selected NAND cell unit e0 connected to the bit line, a large potential difference (about 20 V) occurs in the gate (Vpgm potential) and channel (Vss potential) of the selected memory cells in the selected NAND cell unit, because the channel in the NAND cell is fixed to Vss; thereby electron injection occurs from a channel to a floating gate in the selected memory cell MTr2, shifting the threshold of the selected memory cell MTr2 to a positive direction.

On the other hand, if "1" data is programmed into the selected memory cell MTr2, Vcc is applied to the bit line BLe0. In the selected NAND cell unit e0 connected to the bit line BLe0, the channels of the NAND memory cell units MTr0 to Mtr 7 are at floating state. Therefore, with capacitive coupling between each of the word lines and the channels, potential of the channel is raised from [Vcc-Vtsg] potential to Vmch potential (program inhibition potential: about 8V) while keeping the channels at the floating state, accompanied by a voltage rise of the word lines, and thus electron injection does not occur. Further, the potential of the channel could be raised too much from the floating state. However, in the driving method of the present embodiment, potentials of the unselected word lines WL1 and WL3 adjacent to the selected word line WL2 are V2 and V3 respectively (Vcc<V2, V3, V2, V3=<Vpass). Therefore, the potentials gradually become lower from the selected word line WL2 toward the unselected word line WL3 at the source side in order to relax surface stresses in the unselected memory cells. As a result, occurrence of the GIDL, wherein charges are leaked from the channel at a floating state, will be suppressed. Therefore, occurrence of program error in the case of programming "1" data in the selected memory cells will be suppressed.

Further, when the selected word line rises from Vpass to Vpgm, program error will be suppressed because both of the word lines adjacent to the selected word line are supplied with voltages equal to or less than Vpass.

Afterwards at the timing t3, a supply of the program voltage Vpgm to the selected word line is terminated and the data programming to the selected memory cells is terminated.

At the timing t4, Vss is applied to the selected word lines and the unselected word lines, and a series of data programming operation is completed.

Then, a verify-read operation for the data programming is performed.

Here, while a case was explained, where the selected memory cell is set as MTr2 and a selected word line is set as WL2, the same program operations are also performed for the other word lines set for selected word lines.

Here, further at the timing t2, the potential of the selected word line WL2 in the selected NAND cell unit e0 was changed from Vpass to Vpgm. At the same time, potential V2 was applied to the unselected word line WL1 adjacent, toward the bit line end, to the unselected word line WL2, and potential V3 was applied to the unselected word line WL3 adjacent, toward the source line end, to the unselected word line WL2. However, if plural unselected word lines exist in the bit line side of the selected word line, the potential V2 may be applied to, not only the unselected word line adjacent, toward the bit line end, to the selected word line, but also to the other plural unselected word lines. Further, if the plural unselected word lines exist, the potential V3 may be supplied to, not only the unselected word line adjacent, toward the source line end, to the selected word lines, but also to the plurality of the other unselected word lines. A bias relationship of the present embodiment is one example, the numbers of the unselected word lines at floating state, the unselected word lines applying the potential V2 and the unselected word lines applying the potential V3, may be optionally changed within the range of the disclosure of the present invention according to the embodiments.

As explained above, in the operation method of the NAND type flash memory in the embodiments, it will suppress a surface stress on the unselected memory cells at program operation. As a result, occurrence of the GIDL, in which charges are leaked from the channels at the floating state, will be suppressed. Therefore, it will suppress program errors in case of "1" data programming.

In the NAND type flash memory and its driving method of this embodiment, Vpass potential is once supplied to the selected word line when program voltage (Vpgm) is to be applied to the selected word line; and after the potential of the selected word line is raised, program voltage (Vpgm) is applied. Therefore, charge pump circuit of program voltage for supplying the potential Vpgm supplies electric charges to charge from the potential Vpass to the potential Vpgm only; thus, amount of supplied electric charges will be reduced. The output of the Vpgm charge pump circuit will become low for a period when the set-up circuit is connected to a capacitive load of the selected word line. However, the recovery time needed for a given output voltage becomes short and the same program rate may be realized even though the drivability of the charge pump circuit of program voltage is low, and thus reduction of the circuit area is possible. Also, drivability of the charge pump circuit of pass voltage may be lowered because the capacitive load of the word line in which Vpass is supplied is reduced, and thus the circuit area may be reduced.

Third Embodiment

In the present embodiment, another driving method of the NAND type flash memory according to the embodiment of the nonvolatile semiconductor memory devices in the present invention will be explained.

In this embodiment, the configuration is not explained because the configuration is the same as the NAND type flash memory 1 of the above-mentioned embodiment, except for a driving method during programming.

Figure 6:
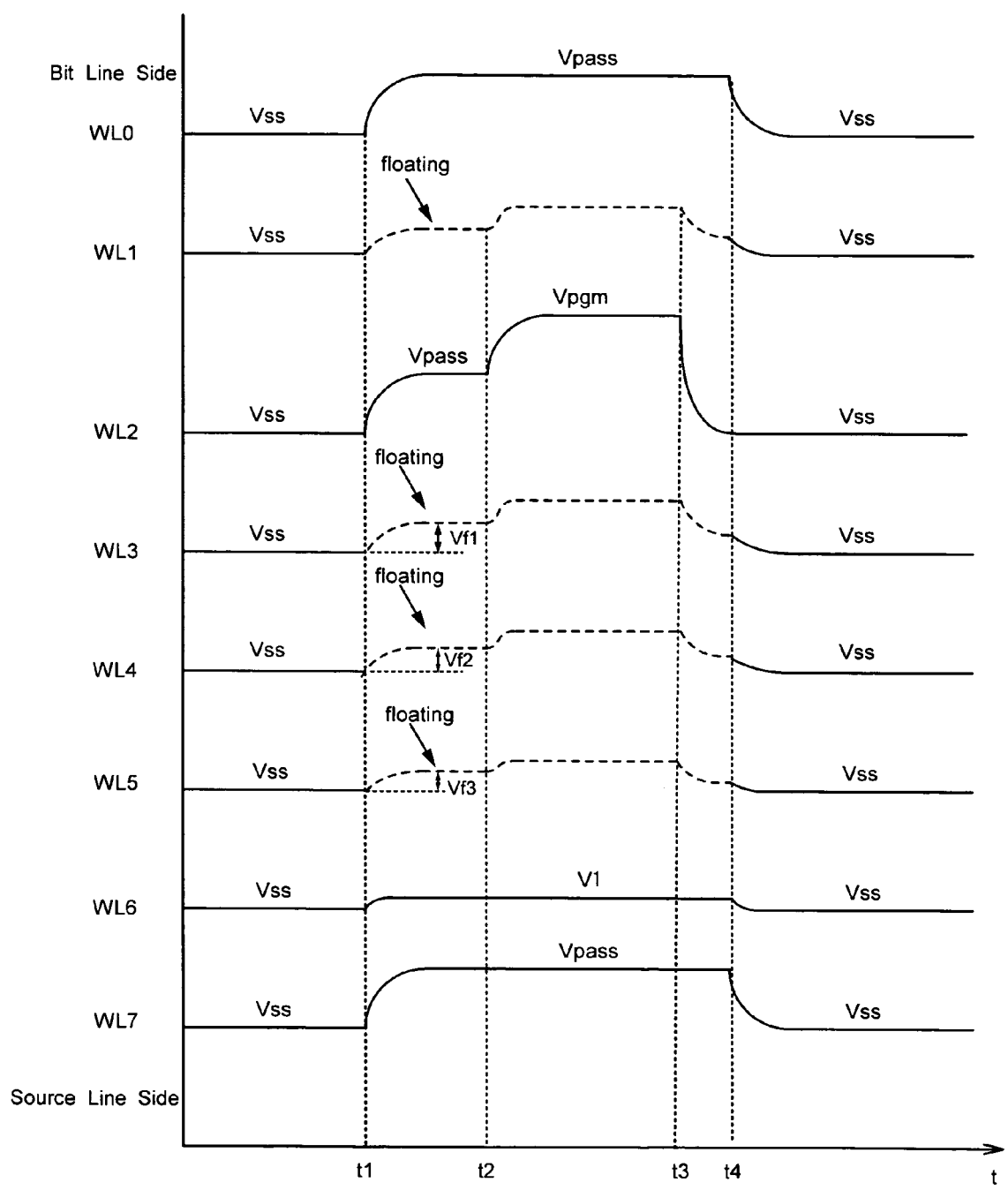
FIG. 6 is a figure showing a change for a set potential of each of the word lines in the selected memory unit of the NAND type flash memory according to one embodiment of a nonvolatile semiconductor memory device of the present invention.

Referring to FIG. 6, a data programming operation of a NAND type flash memory 1 of the present invention will be explained. The program operation of this embodiment is ONE variation of SB 2 method. In FIG. 6, as well as the above-mentioned embodiment, changes for set potentials of each of the word lines WL0 to WL7 are shown, in the case where the memory cells connected to word line WL2 in the selected NAND cell unit in which, for example, even number pages of the BLOCKi is selected for a data programming (for example, NAND cell unit e0 of the BLOCKi), in the data programming operation of the NAND type flash memory 1.

First, similar to the above-mentioned embodiment, a data programming operation is initiated, Vss ("0" data programming) or power supply voltage Vcc ("1" data programming) is applied to the bit line BLe0 connected to the selected NAND cell unit e0 corresponding to the program data; and Vcc is applied to the selection gate line SGD_i on the bit line side. In this case, the channel in the NAND memory cells is fixed to Vss via the selection gate transistor Tr0 in the connected and selected NAND cell unit e0, when the bit line BLe0 is Vss ("0" data programming). On the other hand in the selected NAND cell unit e0, when the bit line BLe0 is Vcc ("1" data programming), the channels of the memory cells Mtr0 to Mtr7 are charged to [Vcc-Vtsg] (Vtsg is a threshold voltage of the selection gate transistor Tr0, e.g., about 1.5 V) via the selection gate transistor Tr0, and thereafter are set to be at a floating state. At this time, Vss is applied to word line WL0 to WL7.

Subsequently at the timing t1, potentials of the unselected word lines WL0 and WL7 in the selected NAND cell units are raised from Vss to Vpass (about 10 V). At the same time, potential of the selected word line WL2 is raised from Vss to Vpass, and potential of a unselected word line (here the unselected word line WL6) which is located apart by at least more than one word line from the selected word line WL2 is set at V1 (Vss=<V1<Vass). Further, the potentials of the unselected word lines WL3 to WL5 which are the word lines at the source line side of the selected word line WL2 and exist between the selected word line WL2 and the unselected word line WL6 receiving V1 potential, and the potential of the unselected word line which is adjacent, toward the bit line, to the selected word line WL2, are set to be the floating state (dotted lines in FIG. 6). By doing this, as shown in FIG. 4, the potentials of the unselected word lines WL3 to WL5 which are the word lines on the source line side of the selected word line WL2 are raised by capacitive coupling with the selected word line WL2, which become Vf1, Vf2, Vf3 (Vf3<Vf2<Vf1), wherein V1<Vpass and thus, a state, in which potentials of the word lines become stepwise lower from the selected word line WL2 toward the unselected word line 6, will be realized.

Afterwards at the timing t2, the potential of the selected word line WL2 is raised from Vpass to Vpgm (about 20 V), keeping the potentials of the unselected word lines WL3 to WL5 at floating state, the unselected word lines WL0 to WL7 at Vpass and the potential of the unselected word line WL6 at V1.

In this state, if "0" data is programmed into the selected memory cell MTr2, Vss is applied to the bit line BLe0, and the channels are fixed to Vss in the selected NAND cell unit e0 connected to the bit line. Therefore, a large potential difference (about 20 V) occurs between the gate of the selected memory cell (Vpgm potential) and channels (Vss potential) in the selected NAND cell unit; and electron injection occurs from the channel to the floating gate in the selected memory cell MTr2. Then the threshold of the selected memory cell MTr2 is shifted to a positive direction.

On the other hand, if "1" data is programmed into the selected memory cell MTr2, Vcc is supplied to the bit line BLe0, and the channels of the NAND memory cells MTr0 to MTr7 are at floating state in the selected NAND cell unit e0 which is connected to the bit line BLe0. Therefore, by capacitive coupling between each of the word lines and the channels in the selected NAND cell unit e0, potential of the channel is raised from [Vcc-Vtsg] potential to Vmch potential (program inhibition potential: about 8V) and is kept at floating state, accompanied by a voltage boosting of the word lines, and thus electron injection into the selected memory cell does not occur. Further, the potential of the channels could be raised too much from the floating state. However, in the driving method of the present embodiment, the potentials of the word lines gradually become lower from the selected word line WL2 toward the unselected word line WL6 so that it will suppress a surface stress on the unselected memory cells which is connected to the unselected word line. As a result, occurrence of the GIDL, wherein charges are leaked from the channel at a floating state, will be suppressed. Therefore, program errors in the case of programming "1" data in the selected memory cells will be suppressed.

At the timing t3, supply of the program voltage Vpgm to the selected word line is terminated and data programming to the selected memory cells is terminated.

At the timing t4, Vss is applied to the selected and unselected word lines, and a series of data programming operation is completed.

Thereafter, a verify-read operation for the data programming is performed.

Here, while this case is explained, wherein the selected memory cell is MTr2 and the selected word line is WL2, the same program operations are also performed for the other word lines.

Here further at a selected word line the timing t2, the potential of the selected word line WL2 in the selected NAND cell unit e0 was raised from Vpass to Vpgm. At the same time, potential V1 was applied to the unselected word line WL6 located apart at least more than one word line against the selected word line toward the source line end. Further, the potentials of the unselected word lines WL3 to WL5, which are the word lines toward the source line end from the selected word line WL2 and exist between the selected word line WL2 and the unselected word line WL6 receiving V1 potential, are set to the floating state. However it is not limited to that. A bias relationship of the present embodiment is one example, positions and numbers of the unselected word lines set to the floating state, the unselected word lines receiving the potential V1 may be changed optionally within the range of the disclosure of the present invention according to the embodiment. If the position of the unselected word line receiving potential V1 is changed, the unselected word lines which exist between the selected word lines and the unselected word line receiving the V1 will be at floating state. Further, the driving method of the embodiment is a variation of the EASB-2 method, therefore in any case, Vpass is applied to the unselected word lines in the source line side of the unselected word lines receiving the potential V1.

Figure 7:
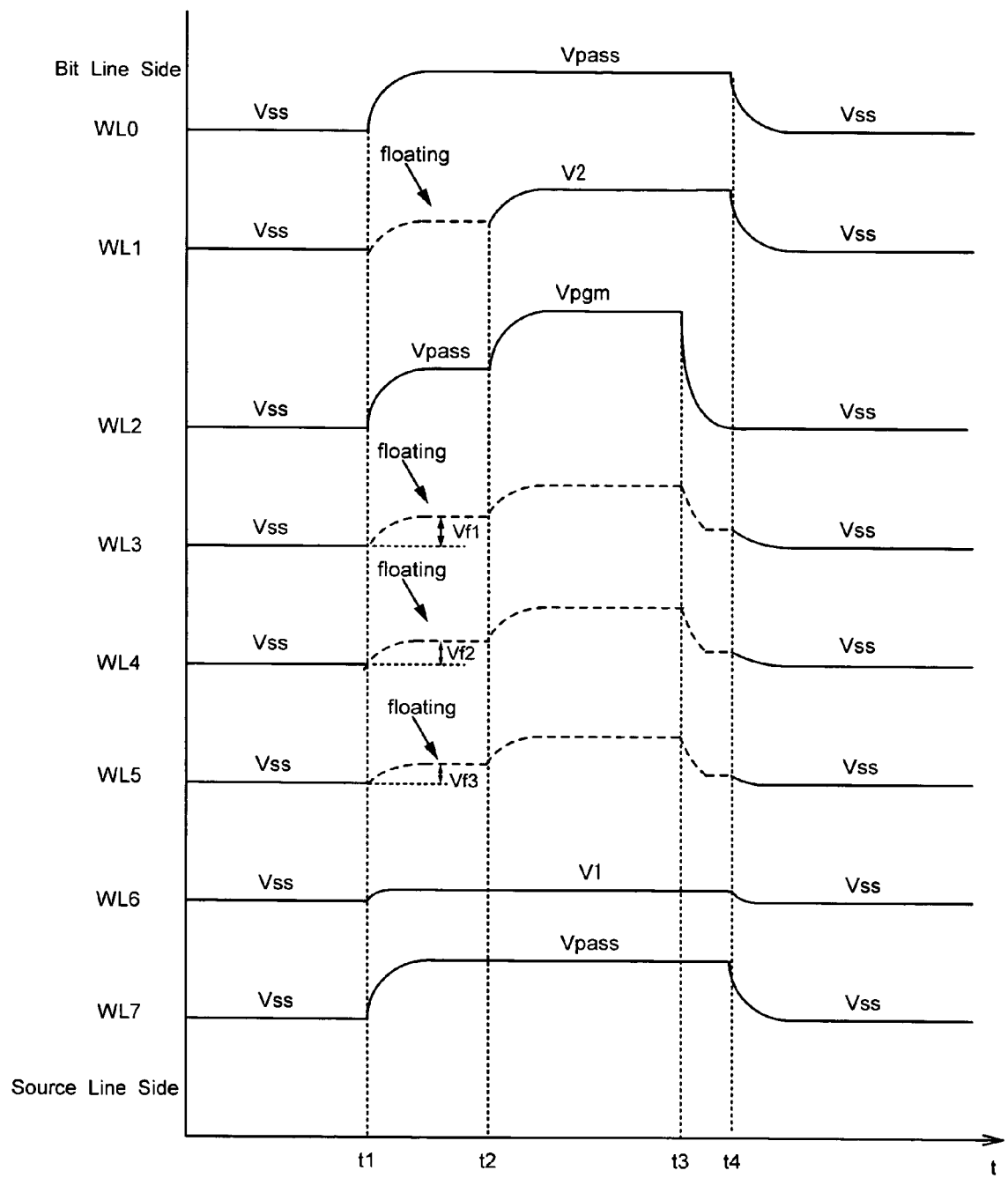
FIG. 7 is a figure showing a change for a set potential of each of the word lines in the selected memory unit of the NAND type flash memory according to one embodiment of a nonvolatile semiconductor memory device of the present invention.

As shown in FIG. 7, at the timing t2, potential V2 (V2<Vpass) may be applied to the word line adjacent to the bit line side for the selected word line WL2; and this potential V2 may be Vpass. As shown in FIG. 7, the reason for applying the potential V2 at the timing t2 is to avoid the case that, when program voltage Vpgm is applied to the selected word line WL2, the potential of the unselected word line WL1 overshoots by a coupling noise between word lines.

Also in the timing t2, Vpass may be applied to the unselected word line WL1 which is adjacent, toward the bit line end, to the selected word line WL2.

Figure 8:
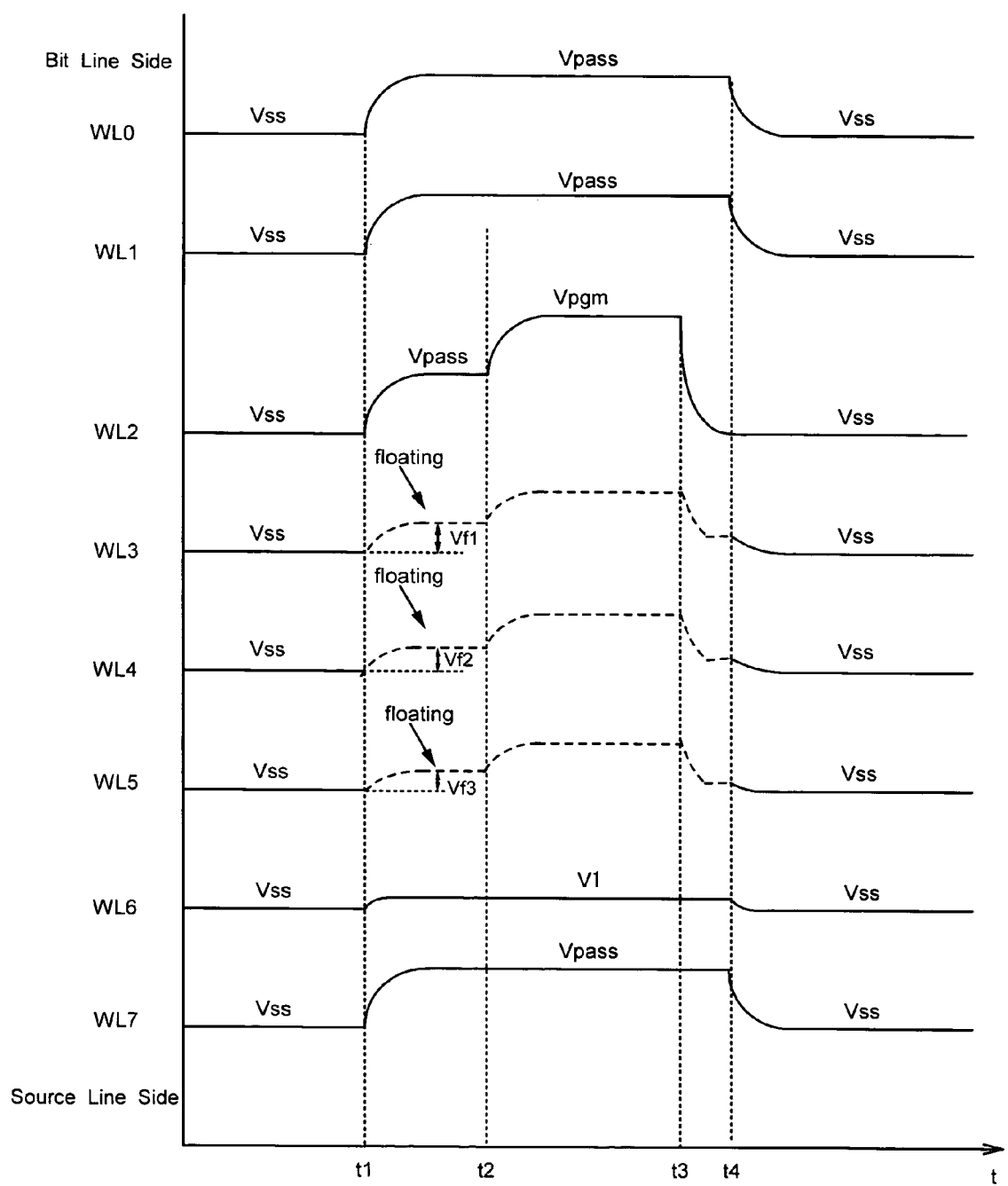
FIG. 8 is a figure showing a change for a set potential of each of the word lines in the selected memory unit of the NAND type flash memory according to one embodiment of a nonvolatile semiconductor memory device of the present invention.

As shown in FIG. 8, at the timing t1, Vpass may be applied to the unselected word line WL1 which is adjacent, toward the bit line end, to the selected word line WL2.

Figure 9:
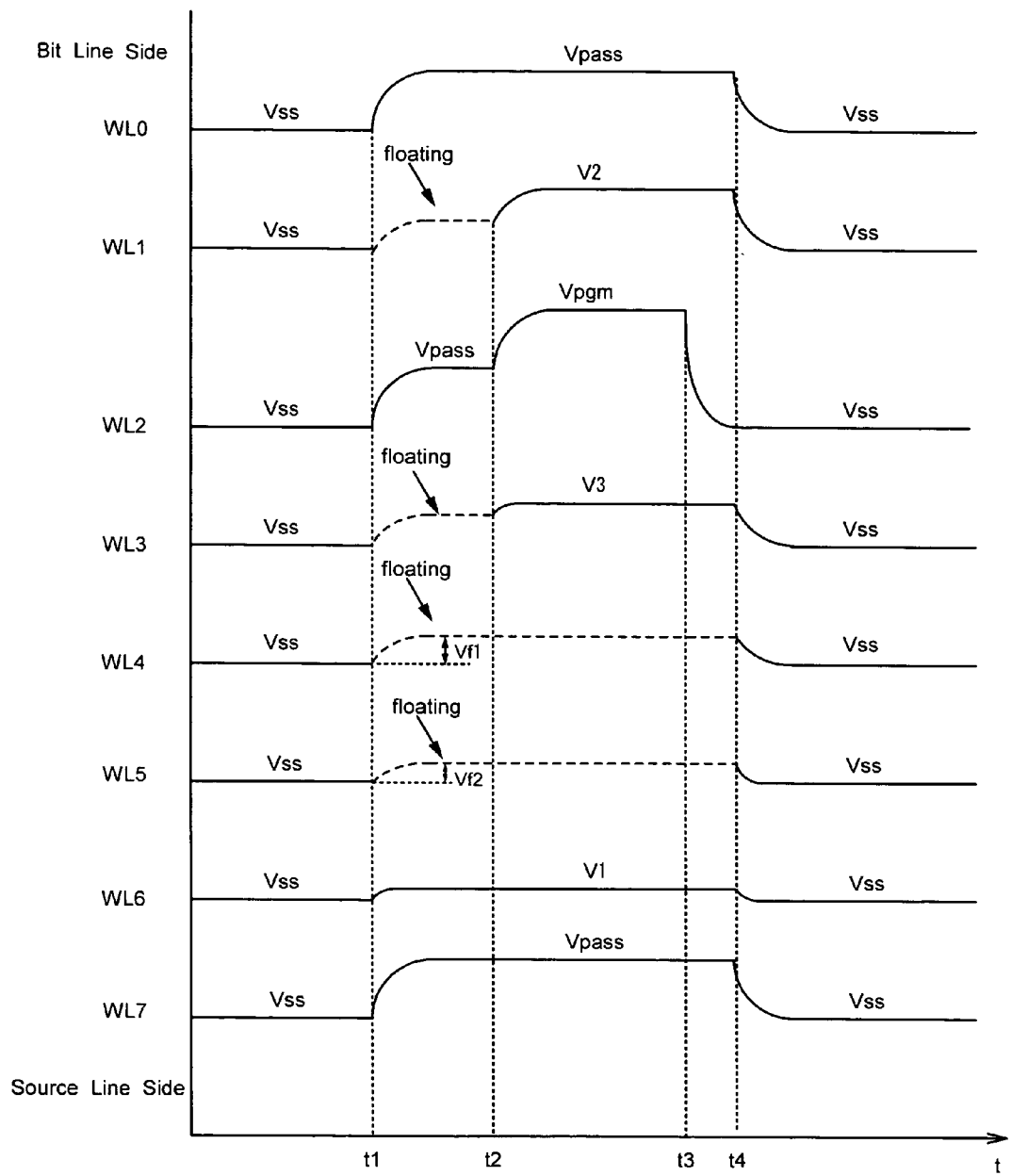
FIG. 9 is a figure showing a change for a set potential of each of the word lines in the selected memory unit of the NAND type flash memory according to one embodiment of a nonvolatile semiconductor memory device of the present invention.

Also, as shown in FIG. 9, at the timing t2, potential V2 is applied to the unselected word line WL1 which is adjacent, toward the bit line end, to the selected word line, and potential V3 (0=<V3=<V2=<Vpass) is applied to the unselected word line WL3 which is adjacent, toward the source line end, to the selected word line. By doing so, the potential differences are moderated toward the unselected word line 6 at the source line side from the selected word line WL2, and the potentials are gradually lowered, suppressing the surface stress at the unselected memory cells. As a result, occurrence of the GIDL in which charges are leaked from the channel at floating state will be suppressed. In this case, Vpass may be applied at the timing t2, as shown in FIG. 8, to the unselected word line WL1 which is adjacent, toward the bit line end, to the selected word line WL2. Or, it may be floating state at the timing t2, as shown in FIG. 6.

Figure 10:
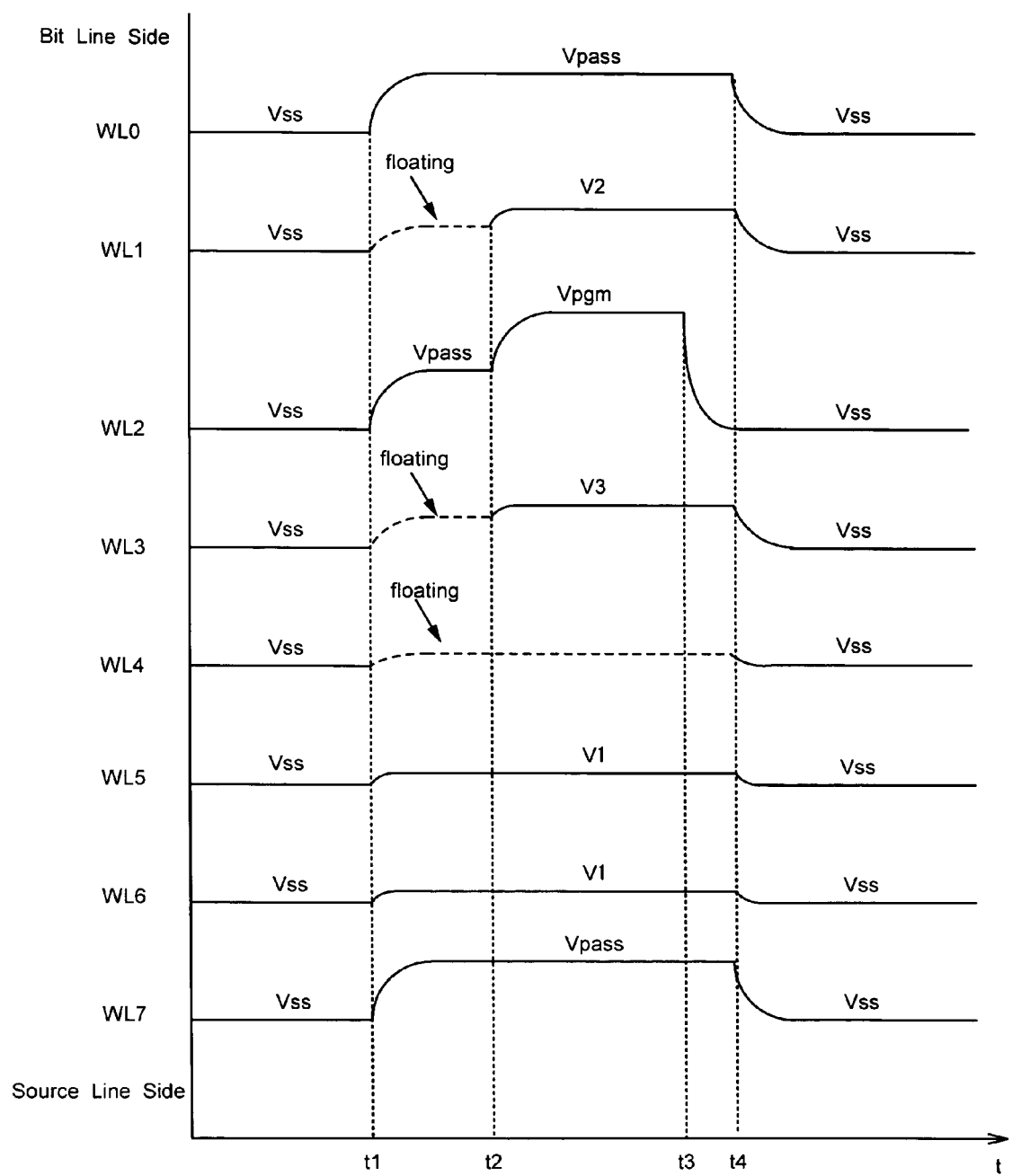
FIG. 10 is a figure showing a change for a set potential of each of the word lines in the selected memory unit of the NAND type flash memory according to one embodiment of a nonvolatile semiconductor memory device of the present invention.

Further, as shown in FIG. 10, the potential V1 may be applied to the plural unselected word lines WL5 and WL6 at the source line side, wherein 0=<V=<V2. By doing so, the potentials are getting lowered gradually decrease from the selected word line WL2 toward the unselected word line WL3 on the source line side, suppressing the surface stress to the unselected memory cells. As a result, occurrence of the GIDL in which charges are leaked from the channel at floating state will be suppressed. The reason for making a number of the unselected word lines in which V1 is applied plural (two lines in the case), is to deal with a situation in which channel lengths of the memory cells become short accompanied by a pattern fineness so that cut-off condition becomes severe.

Further in the driving method shown in FIG. 10, at the timing t1, a potential V1 is applied to the WL5 and WL6 of the plural unselected word lines on the source line side and a potential V3 is applied to the unselected word line WL3. However, the number of the plural unselected word lines which receive potential V1, is not limited to that.

As explained above, in the driving method of the NAND type flash memory in the embodiment will suppress a surface stress will be suppressed at the unselected memory cells during program. As a result, occurrence of the GIDL, wherein charges are leaked from the channel at a floating state, will be suppressed. Therefore, occurrence of program error in the case of programming "1" data in the selected memory cells will also be suppressed.

Like the above-mentioned embodiment and the embodiment 2, in the NAND type flash memory of the embodiment, Vpass potential is once applied to the selected word line to which program voltage (Vpgm) is to be applied, and after the potential of the selected word line is raised, program voltage (Vpgm) is applied. Therefore, the charge pump circuit of program voltage for supplying the potential Vpgm will supply electric charges for stepping up from the potential Vpass to the potential Vpgm only, thus, the amount of supplied electric charges may be reduced. The output of the Vpgm charge pump circuit will become lower for a period when a capacitive load of the selected word line is connected. However, the recovery time required for a given output voltage becomes shorter and the same program speed may be realized even though the drivability of the charge pump circuit of program voltage is lower, and thus reduction of the circuit area will be possible. Also, drivability of the charge pump circuit of pass voltage may be lowered because the capacitive load of the word line in which Vpass is applied is reduced, and thus the circuit area may be reduced.

The driving method shown in FIG. 6, the capacitive load of the word lines in which Vpass are applied is reduced, and drivability of the charge pump circuit of pass voltage may be reduced. Thus, the circuit area may be reduced. Further, an additional power supply circuit is unnecessary because the word line voltage from the selected word line to the unselected word lines applying V1 may be gradually lowered without the additional power. Thus, occurrence of the GIDL will be suppressed without an increase of the circuit area.

As shown in FIG. 7, if the voltage V2 equal to or less than Vpass is applied when the selected word line rises from Vpass to Vpgm, it will suppress program errors in the word lines adjacent to the bit line side of the selected word line.

As shown in FIG. 9, the controllability of the potential relationship, in which a word line voltage from the selected word line to the unselected word line for receiving Vss gradually becomes lower, by applying the voltage V3 equal to or less than Vpass to the word lines adjacent, toward the source line end to the selected word line, a occurrence of the GIDL will be suppressed more efficiently.

The bias relationship in this embodiment is one example and positions and numbers of the unselected word lines at the floating state and unselected word lines receiving the potential V1, V2 and V3 may be optionally changed within the range of the disclosure of the present invention according to the embodiment.

Fourth Embodiment

One variation of another driving method of the NAND type flash memory of the nonvolatile semiconductor memory device of the present invention according to the above-mentioned embodiment 3 will be explained.

In this embodiment, the configuration is not explained because the configuration is the same as the NAND type flash memory 1 of the above-mentioned embodiment, except for a driving method during programming.

Figure 11:
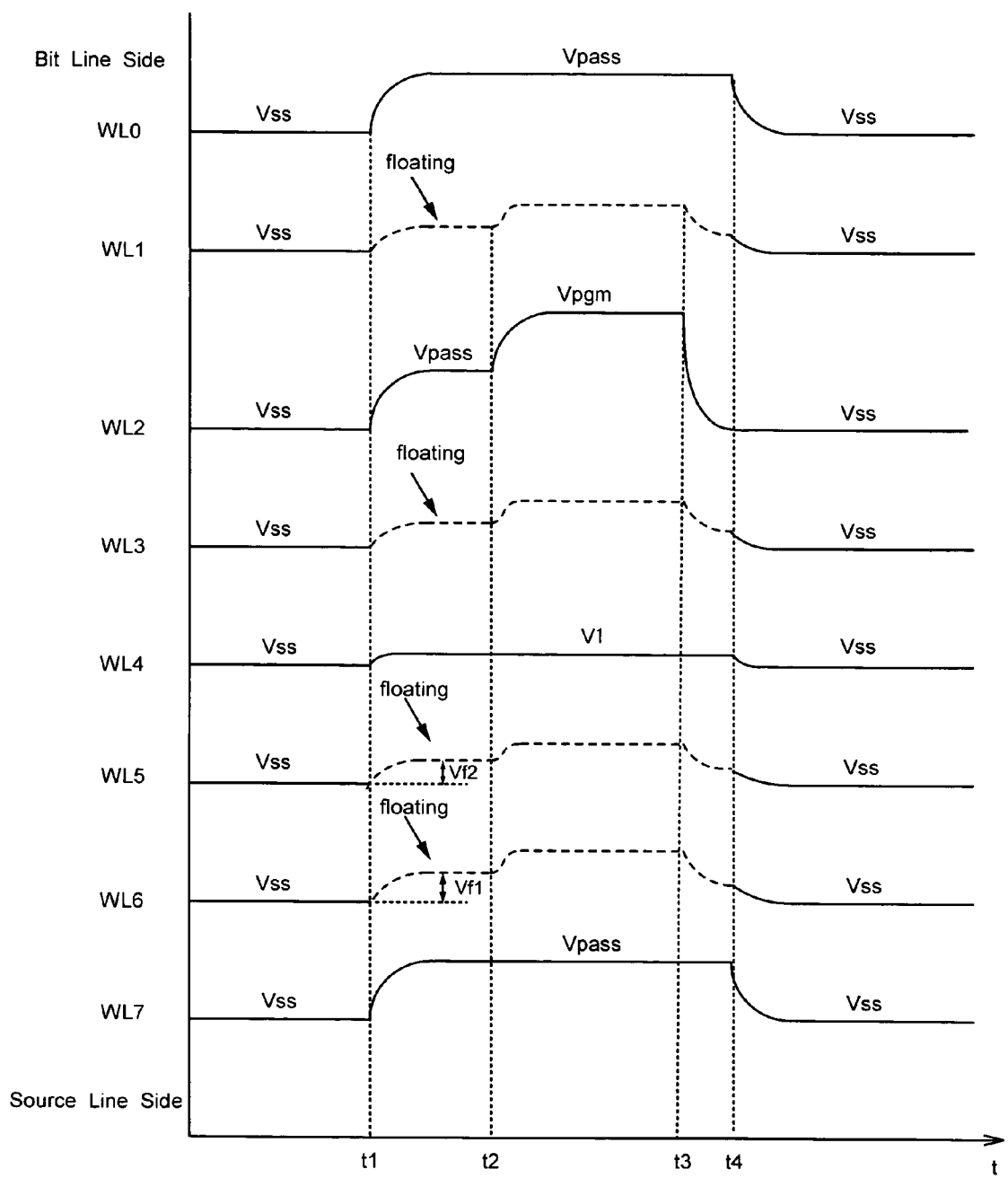
FIG. 11 is a figure showing a change for a set potential of each of the word lines in the selected memory unit of the NAND type flash memory according to one embodiment of a nonvolatile semiconductor memory device of the present invention.

Referring to FIG. 11, a data programming operation of a NAND type flash memory 1 of the present invention will be explained. The program operation of the embodiment is a variation of the EASB 2 method as similar to the Embodiment 2. In FIG. 11, as in the above-mentioned preferred embodiment, changes for set potentials of each of the word lines WL0 to WL7 are shown, in the case that the memory cells connected to word line WL2 in the selected NAND cell unit in which, for example, even number pages of the BLOCKi is selected and which is selected for a data programming (for example, NAND cell unit e0 of the BLOCKi), in the data programming operation of the NAND type flash memory 1.

At first, similar to the driving method explained in the above-mentioned preferred embodiment, data program operation is initiated, Vss ("0" data programming) or power supply voltage Vcc ("1" data programming) is applied to bit line BLe0 connected to the selected NAND cell unit e0 in response to the program data, and Vcc is applied to the bit line side selection gate line SGD_i. In this case, when the bit line BLe0 is at Vss ("0" data programming), channels in the NAND memory cells are fixed to Vss via the selection gate transistor in the connected and selected NAND cell unit e0. On the other hand, when the bit line BLe0 is at Vcc ("1" data programming), channels of the memory cells MTr0 to MTr 7 is charged up to [Vcc-Vtsg] (Vtsg is a threshold voltage of the selection gate transistor Tr0, e.g., about 1.5 V) via the selection gate transistor Tr0, and thereafter are set to floating state. At the time, Vss is applied to the word lines WL0 to WL7.

Subsequently at the timing t1, potentials of the unselected word line WL0 and WL7 are raised from Vss to Vpass (about 10 V). At the same time, potential of selected word line WL2 is raise from Vss to Vpass, and potentials of unselected word lines at the source line side of the selected word line WL2 (here, the unselected word line WL4) is V1 (Vss=<V1<Vpass). And the potentials of the unselected word lines WL5 and 6, which are word lines at the source line side of the selected word line WL2 and are between the selected word line WL2 and the unselected word line WL4 receiving V1 are set to the floating state. The potentials of the unselected word lines WL1 and WL3 adjacent to the bit line side and the source line side of the selected word line WL2, are set to the floating state (dotted lines in FIG. 1).

Then at the timing t2, potentials of the selected word line WL2 are raised from Vpass to Vpgm (about 20 V), keeping potentials of the unselected word line WL1, WL3, WL5 and WL6, the potentials of the unselected word line 0 and WL7 at the floating state; the potentials of the unselected word line WL0 and WL7 at Vpass; and the potential of the unselected word line WL4 at V1.

In this state, when "0" data is programmed into the selected memory cell Mtr2, Vss potential is applied to the bit line BLe0. A large potential difference (about 20V) occurs between the gate (Vpgm potential) and the channel (Vss potential) of the selected memory cells in the selected NAND cell units, because channel in the NAND cell is fixed to Vss in the selected NAND cell unit e0 connected to the bit line, which in turn causes occurrence of the electron injection from the channel into the floating gate in the selected memory cells Mtr2. The threshold of the selected memory cell Mtr2 shifts to a positive direction.

On the other hand, when "1" data is programmed into the selected memory cell MTr2, Vcc is applied to the bit line e0. In the selected NAND cell unit e0 connected to the bit line BLe0, the channels of NAND memory cells MTr0 to MTr7 are at floating state. Therefore, by capacitive coupling between each of the word lines and the channels, potential of the channel is raised from [Vcc-Vtsg] potential to Vmch potential (program inhibition potential: about 8V) and is kept at floating state, accompanied by a voltage rise of the word lines, and thus electron injection does not occur. Further, the potential of the channel could be raised too much from the floating state. However, in the driving method of the present embodiment, potentials of the word lines are sequentially lowered toward the unselected word line WL7 to WL4. Therefore, the surface stress to the unselected memory cells connected to the unselected word lines will be suppressed. As a result, occurrence of the GIDL, wherein charges are leaked form the channel at a floating state, will be suppressed. Therefore, occurrence of program error in case of programming "1" data in the selected memory cells will be suppressed.

Also in the embodiment, for simplicity, the unselected word lines are illustrated as one word line (WL3) set to floating state, which is between the word line WL2 and the unselected word line WL4 receiving V1. However, by making the unselected word lines as plural word lines (for example, supplying V1 to the unselected word line WL5 and making WL3 and WL4 floating), a state in which the voltage is gradually lowered may be formed for these unselected word lines, as they are becoming closer to the source line side. Thus, occurrence of the GIDL will be suppressed.

Figure 12:
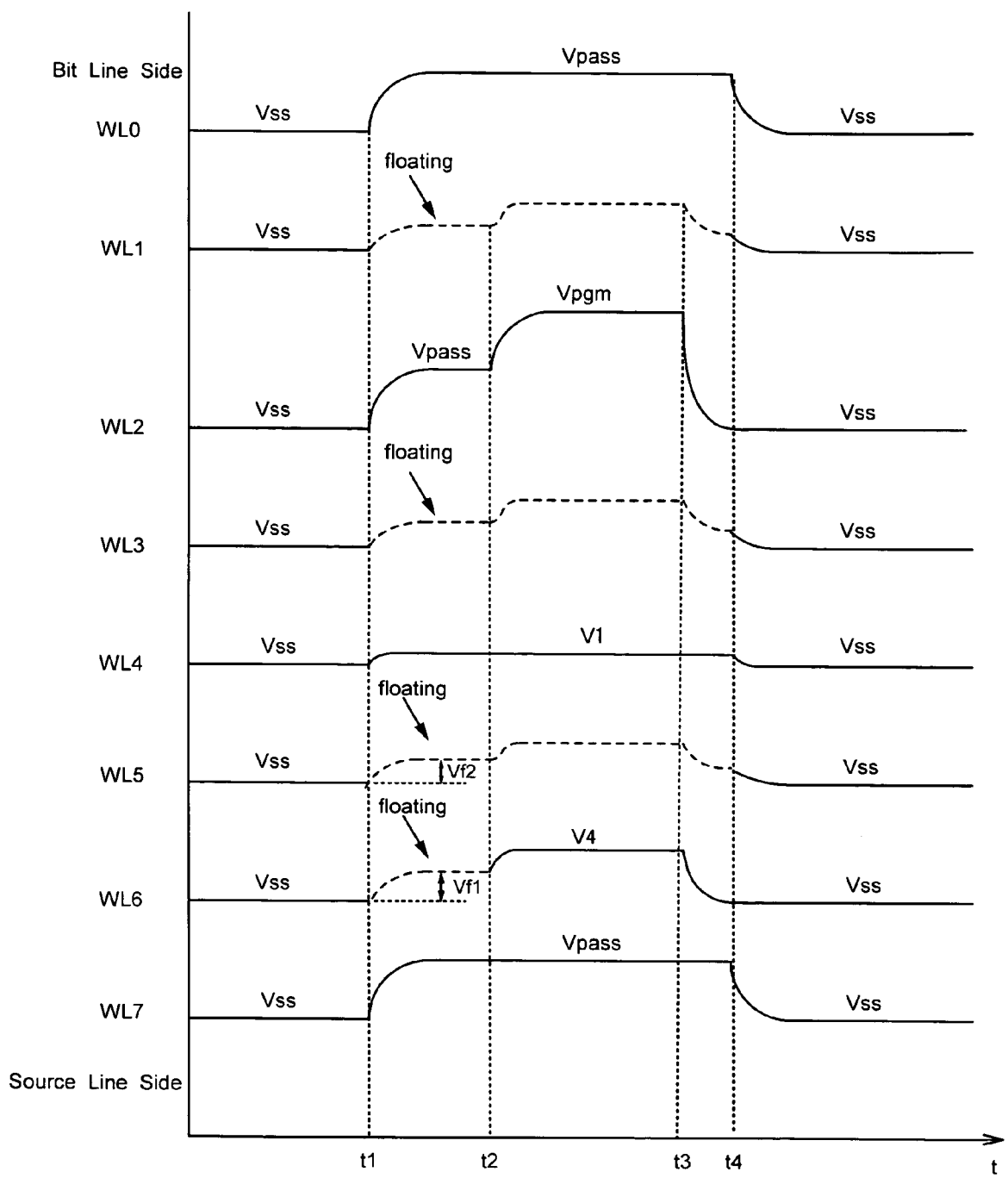
FIG. 12 is a figure showing a change for a set potential of each of the word lines in the selected memory unit of the NAND type flash memory according to one embodiment of a nonvolatile semiconductor memory device of the present invention.

Further as shown in FIG. 12, in the timing t2, a potential V4, which is the potential equal to or less than Vpass, may be applied to the unselected word line (WL6 in FIG. 12), which is at the source line side from the unselected word line WL4 receiving the selected word line WL2 and potential V1, and wherein the unselected word line is set to floating state at the timing t1. In this case, potentials of the word lines are sequentially lowered toward the unselected word line WL7 to WL4. And the controllability will improve, by supplying V4 to WL6. As a result, occurrence of the GIDL will be suppressed.

Then at the timing t3, supply of the program voltage Vpgm to the selected word line is terminated, and data programming into the selected memory cells is terminated.

At the timing t4, Vss is applied to the selected word line and the unselected word lines, and thus a series of data program operations is completed.

Afterwards, a verify-read operation for the data programming is performed.

While a case is explained, wherein the selected memory cell is MTr2 and the selected word line is WL2, similar program operations are also performed in the case that the other word lines are selected word lines.

The bias relationship of the present embodiment is one example, and positions and numbers of the unselected word lines set to floating state, unselected word lines receiving the potential V1 and unselected word lines receiving the potential V4, may be optionally changed within the range of the disclosure of the present invention according to the embodiment.

The nonvolatile semiconductor memory device according to the present invention performs the above-mentioned outstanding effects so that the device may be used as memory devices for electronic instruments such as computers, digital still cameras, cellular phones, and household electrical appliances, etc.

What is claimed is:

1. A non-volatile semiconductor memory device comprising:
   a memory cell array having a plurality of memory cell units each having a plurality of electrically-programmable memory cell connected in series;
   a plurality of word lines each connected to each of control gates of said plurality of memory cells, said plurality of word lines including a selected word line connected to a control gate of selected one of said memory cells for programming, and a plurality of unselected word lines different from said selected word line;
   a bit line connected to one end of said memory cell unit; and
   a source line connected to an other end of the memory cell unit;
   wherein, when data is programmed into the selected memory cells, a first potential is applied to said selected word line, and a first unselected word line adjacent, toward a source line side, to said selected word line is set to floating state, and thereafter, a second potential which is higher than said first potential is applied to said selected word line.

2. The non-volatile semiconductor memory device according to claim 1, wherein when the first potential is applied to the selected word line, a second unselected word line adjacent, toward a bit line side, to said selected word line is set to floating state.

3. The non-volatile semiconductor device according to claim 1, wherein when the first potential is applied to the selected word line and when the second potential is applied to the selected word line, a third potential, which is lower than said second potential, is applied to plural parts of said plurality of unselected word lines other than said first unselected word line adjacent, toward a source line side, to said selected word line.

4. The non-volatile semiconductor device according to claim 2, wherein when the first potential is applied to the selected word line and when the second potential is applied to the selected word line, a third potential, which is lower than said second potential, is applied to plural parts of said plurality of unselected word lines other than said first unselected word line adjacent, toward the source line end, to said selected word line and said second unselected word line adjacent, toward the bit line side, to said selected word line.

5. The non-volatile semiconductor device according to claim 2, wherein when the second potential is applied to the selected word line, a third potential which is not greater than said first potential is applied to said first unselected word line adjacent, toward the source line end, to said selected word line, and a fourth potential which is not greater than said first potential is applied to said second unselected word line adjacent, toward the bit line end, to said selected word line.

6. The non-volatile semiconductor device according to claim 4, wherein said plural parts of said plurality of unselected word lines other than said first unselected word line adjacent, toward the source line end, to said selected word line and said second unselected word line adjacent, toward the bit line side, to said selected word line are all of remaining word lines connected to said memory cell unit except said selected word line, and said first and second unselected word lines.

7. The non-volatile semiconductor device according to claim 5, wherein when the first potential is applied to the selected word line and when the second potential is applied to the selected word line, the first potential is applied to all remaining word lines connected to said memory cell unit except said selected word line, and said first and second unselected word lines.

8. The non-volatile semiconductor device according to claim 1, wherein when the first potential is applied to said selected word line and when the second potential is applied to the selected word line, a third potential which is higher than 0V but lower than said first potential is applied to a second unselected word line which is not in adjacent to said selected word line and exists between said selected word line and said source line.

9. The non-volatile semiconductor device according to claim 8, wherein plural unselected word lines between said selected word line and said second unselected word line are set to be at floating state.

10. The non-volatile semiconductor device according to claim 8, wherein when the first potential is applied to said selected word line and when the second potential is applied to the selected word line, said third potential is applied to a third unselected word line which is in adjacent, toward a source line side, to said second unselected word line and exists between said second unselected word line and said source line.

11. The non-volatile semiconductor device according to claim 8, wherein when the first potential is applied to said selected word line and when the second potential is applied to the selected word line, said first potential is applied to a third unselected word line which is the closest to said source line.

12. The non-volatile semiconductor device according to claim 11, wherein when the second potential is applied to said selected word line, a fourth potential which is not greater than said first potential is applied to a fourth unselected word line which is adjacent to said third unselected word line which is the closest to said source line.

13. The non-volatile semiconductor device according to claim 1 further comprising a selection gate transistor between said bit line and said memory cell unit, a gate of said selection gate transistor being applied with a potential during programming so that a channel region of a memory cell transistor connected to said selected word line is charged to inhibit electron injections to said memory cell transistor when a potential at said bit line is not 0V.

14. The non-volatile semiconductor device according to claim 1 further comprising a first voltage charge pump circuit to generate said second potential from a power potential.

15. The non-volatile semiconductor device according to claim 14 further comprising a second voltage charge pump circuit to generate said first potential from a power potential.

16. The non-volatile semiconductor device according to claim 14 further comprising a row decoder circuit connected to said first voltage charge pump circuit, said row decoder circuit selects said selected word line and provides said second potential to said selected word line.

17. The non-volatile semiconductor device according to claim 15 further comprising a row decoder circuit connected to said first and second voltage charge pump circuits, said row decoder circuit selects said selected word line and provides said first potential and then said second potential to said selected word line.

18. A method for programming NAND-type flash memory having a selection gate transistor and a series connected memory cells comprising:
 a first step for providing a Vcc to turn on said selection gate transistor, providing a Vpass higher than said Vcc to a selected word line, floating a first adjacent word line which is adjacent to said selected word line, and providing said Vpass to a number of unselected word lines; and
 a second step following said first step for providing Vpgm which is higher than said Vpass to the selected word line.

19. The method for programming NAND-type flash memory according to claim 18 wherein the second step includes keeping said first adjacent word line to floating state.

20. The method for programming NAND-type flash memory according to claim 18 wherein the first step includes floating a second adjacent word line which is adjacent to said selected word line.

* * * * *